(12) United States Patent
Bae et al.

(10) Patent No.: US 11,882,750 B2
(45) Date of Patent: Jan. 23, 2024

(54) DISPLAY PANEL

(71) Applicant: Samsung Display Co., Ltd., Yongin-Si (KR)

(72) Inventors: Kwang Soo Bae, Yongin-si (KR); Eun-Ae Kwak, Gunpo-si (KR); Beomsoo Park, Seongnam-si (KR); Minjeong Oh, Gimpo-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 464 days.

(21) Appl. No.: 17/141,539

(22) Filed: Jan. 5, 2021

(65) Prior Publication Data
US 2021/0313400 A1    Oct. 7, 2021

(30) Foreign Application Priority Data
Apr. 6, 2020    (KR) .................. 10-2020-0041367

(51) Int. Cl.
*H10K 59/38*    (2023.01)
*H10K 50/86*    (2023.01)
*H10K 59/122*   (2023.01)
*H10K 71/00*    (2023.01)
(Continued)

(52) U.S. Cl.
CPC .......... *H10K 59/38* (2023.02); *H10K 50/865* (2023.02); *H10K 59/122* (2023.02); *H10K 71/00* (2023.02); *H10K 59/1201* (2023.02); *H10K 2102/331* (2023.02)

(58) Field of Classification Search
CPC .... H10K 59/38; H10K 50/865; H10K 59/122; H10K 71/00; H10K 59/1201; H10K 2102/331; H10K 59/8792; H10K 59/1213; H10K 50/8426; H10K 50/85; H10K 50/86; H10K 59/126
See application file for complete search history.

(56) References Cited

U.S. PATENT DOCUMENTS 7,633,595 B2    12/2009   Kim et al.
7,898,167 B2 *  3/2011    Song ................. H10K 59/12
                                                    313/506
9,515,285 B2    12/2016   Sato
(Continued)

FOREIGN PATENT DOCUMENTS

JP          6357349 B2    7/2018
KR        101016740 B1    2/2011
(Continued)

*Primary Examiner* — Kevin Quarterman
(74) *Attorney, Agent, or Firm* — CANTOR COLBURN LLP

(57) ABSTRACT

A display panel includes an emission element which outputs a source light and includes a first electrode, an emission layer disposed on the first electrode, and a second electrode disposed on the emission layer; a pixel definition layer defining an opening exposing at least a portion of the first electrode; a light-conversion pattern disposed on the pixel definition layer; a first light-blocking pattern disposed on an outer side of the light-conversion pattern in a plan view; and a second light-conversion pattern disposed on the emission element and which overlaps with the emission element in the plan view, wherein the first and second light-conversion patterns are spaced apart from each other or forming an interface therebetween.

22 Claims, 20 Drawing Sheets

(51) Int. Cl.
    *H10K 59/12*         (2023.01)
    *H10K 102/00*      (2023.01)

(56) References Cited

U.S. PATENT DOCUMENTS

| | | |
|---|---|---|
| 10,048,412 B2 | 8/2018 | Li |
| 2014/0353630 A1 | 12/2014 | Baek et al. |
| 2017/0125740 A1 | 5/2017 | Lee et al. |
| 2018/0166519 A1* | 6/2018 | Kim .................... H10K 59/122 |
| 2020/0075879 A1* | 3/2020 | Luo ..................... H10K 77/111 |
| 2020/0343310 A1* | 10/2020 | Bae ..................... H10K 59/126 |
| 2020/0391048 A1* | 12/2020 | Lee ........................ H10K 50/82 |
| 2021/0109617 A1* | 4/2021 | Lin ..................... H01L 27/1214 |

FOREIGN PATENT DOCUMENTS

| | | |
|---|---|---|
| KR | 1020140127136 A | 11/2014 |
| KR | 1020170051764 A | 5/2017 |
| KR | 1020180079581 A | 7/2018 |

\* cited by examiner

DISPLAY PANEL

This application claims priority to Korean Patent Application No. 10-2020-0041367, filed on Apr. 6, 2020, and all the benefits accruing therefrom under 35 U.S.C. § 119, the content of which in its entirety is herein incorporated by reference.

BACKGROUND

The present disclosure relates to a display panel, and in particular, to a display panel including a light-conversion pattern.

A display panel includes a transmission-type display panel of selectively transmitting a source light generated by a light source and an emission-type display panel of generating a source light. In order to produce a color image, the display panel includes different kinds of color control layers, which are determined by colors of pixels. The color control layer transmits a source light within a specific wavelength range or changes a color of a source light. In some cases, the color control layer does not change the color of the source light and changes optical characteristics of the source light.

SUMMARY

An embodiment of the inventive concept provides a display panel with improved optical conversion efficiency.

According to an embodiment of the inventive concept, a display panel includes an emission element outputting a source light, a pixel definition layer, a first light-conversion pattern, a first light-blocking pattern, and a second light-conversion pattern. The emission element includes a first electrode, an emission layer disposed on the first electrode, and a second electrode disposed on the emission layer. The pixel definition layer defines an opening exposing at least a portion of the first electrode. The first light-conversion pattern is disposed on the pixel definition layer, and the first light-blocking pattern is disposed on an outer side of the first light-conversion pattern in a plan view. The second light-conversion pattern is disposed on the emission element and overlaps with the emission element in the plan view. The first and second light-conversion patterns are spaced apart from each other or form an interface therebetween.

In an embodiment, the first light-conversion pattern may be in contact with the pixel definition layer.

In an embodiment, the emission element may further include at least one of a hole control layer and an electron control layer, which overlaps with at least the emission layer in the plan view. A portion of the at least one of the hole and electron control layers may be disposed between the pixel definition layer and the first light-conversion pattern.

In an embodiment, the first light-conversion pattern may include a plurality of sub-light-conversion patterns which are disposed outside the opening in the plan view. At least two adjacent sub-light-conversion patterns of the plurality of sub-light-conversion patterns may be spaced apart from each other in the plan view.

In an embodiment, the first light-conversion pattern may include a first sub-light-conversion pattern and a second sub-light-conversion pattern, which are spaced apart from each other in a first direction crossing an extension direction of the first and second sub-light-conversion patterns, and a third sub-light-conversion pattern and a fourth sub-light-conversion pattern, which are spaced apart from each other in a second direction crossing an extension direction of the third and fourth sub-light-conversion patterns. The extension direction of the first sub-light-conversion pattern and the extension direction of the third sub-light-conversion pattern may cross each other. The first sub-light-conversion pattern may be spaced apart from at least one of the third and fourth sub-light-conversion patterns in the plan view, and the second sub-light-conversion pattern may be spaced apart from at least one of the third and fourth sub-light-conversion patterns in the plan view.

In an embodiment, the display panel may further include a color filter which overlaps with the emission element in the plan view.

In an embodiment, the display panel may further include an organic layer, which is disposed on the color filter and provides a flat top surface.

In an embodiment, the first light-conversion pattern and the second light-conversion pattern may include the same quantum dot.

In an embodiment, the display panel may further include a second light-blocking pattern disposed on the first light-blocking pattern.

In an embodiment, the first light-blocking pattern may include a metal layer, and the second light-blocking pattern may include a black coloring agent.

In an embodiment, the first light-blocking pattern and the second light-blocking pattern may include a black coloring agent.

In an embodiment, the second light-blocking pattern may enclose the opening in the plan view. At least a portion of the first light-conversion pattern may be disposed between the opening and the second light-blocking pattern in the plan view.

According to an embodiment of the inventive concept, a display panel includes first and second emission elements which output a source light, a pixel definition layer, a plurality of first lateral light-conversion patterns, a plurality of second lateral light-conversion patterns, a first front light-conversion pattern, a second front light-conversion pattern, and a first light-blocking pattern. Each of the first and second emission elements includes a first electrode, an emission layer disposed on the first electrode, and a second electrode disposed on the emission layer. The pixel definition layer defines first and second openings, which at least partially expose the first electrodes of the first and second emission elements, respectively. The plurality of first lateral light-conversion patterns is disposed on the pixel definition layer and encloses the first opening in a plan view. The plurality of second lateral light-conversion patterns is disposed on the pixel definition layer and encloses the second opening in the plan view. The first front light-conversion pattern and the second front light-conversion pattern are disposed on the first emission element and the second emission element, respectively. The first light-blocking pattern is disposed on outer sides of the plurality of first lateral light-conversion patterns and outer sides of the plurality of second lateral light-conversion patterns in the plan view.

In an embodiment, the first electrode of the first emission element and the first electrode of the second emission element may be spaced apart from each other in the plan view. The second electrode of the first emission element and the second electrode of the second emission element may be provided in a form of a single object.

In an embodiment, two adjacent first lateral light-conversion patterns of the plurality of first lateral light-conversion patterns may be spaced apart from each other to form a gap region therebetween in the plan view. A portion of the second electrode may be disposed in the gap region.

In an embodiment, the first light-blocking pattern may include a metal layer. The metal layer may be disposed between a first lateral light-conversion pattern and a second lateral light-conversion pattern, which are selected from the plurality of first lateral light-conversion patterns and the plurality of second lateral light-conversion patterns, respectively, and are adjacent to each other. The metal layer may be disposed on surfaces of the outer sides of the first and second lateral light-conversion patterns.

In an embodiment, the display panel may further include an upper insulating layer disposed on the first emission element, the second emission element, and the metal layer.

In an embodiment, the display panel may further include a second light-blocking pattern disposed on the first light-blocking pattern. The second light-blocking pattern may be disposed on a portion of the upper insulating layer, and the second light-blocking pattern may be disposed on the metal layer.

In an embodiment, the second electrode of the first emission element and the second electrode of the second emission element may be provided in the form of a single object. The metal layer may be in contact with the second electrode.

In an embodiment, the first light-blocking pattern may include a black coloring agent. The black coloring agent may be disposed between a first lateral light-conversion pattern and a second lateral light-conversion pattern, which are selected from the plurality of first lateral light-conversion patterns and the plurality of second lateral light-conversion patterns, respectively, and are adjacent to each other. The black coloring agent may fill a valley defined between the first and second lateral light-conversion patterns.

In an embodiment, the display panel may further include a second light-blocking pattern disposed on the first light-blocking pattern. The second light-blocking pattern may enclose the first opening and the second opening in the plan view. The first front light-conversion pattern and the second front light-conversion pattern may have top surfaces which are positioned at a level different from or lower than a top surface of the second light-blocking pattern.

In an embodiment, the display panel may further include a first color filter which transmits a first light emitted from the plurality of first lateral light-conversion patterns and the first front light-conversion pattern, and a second color filter which transmits a second light emitted from the plurality of second lateral light-conversion patterns and the second front light-conversion pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
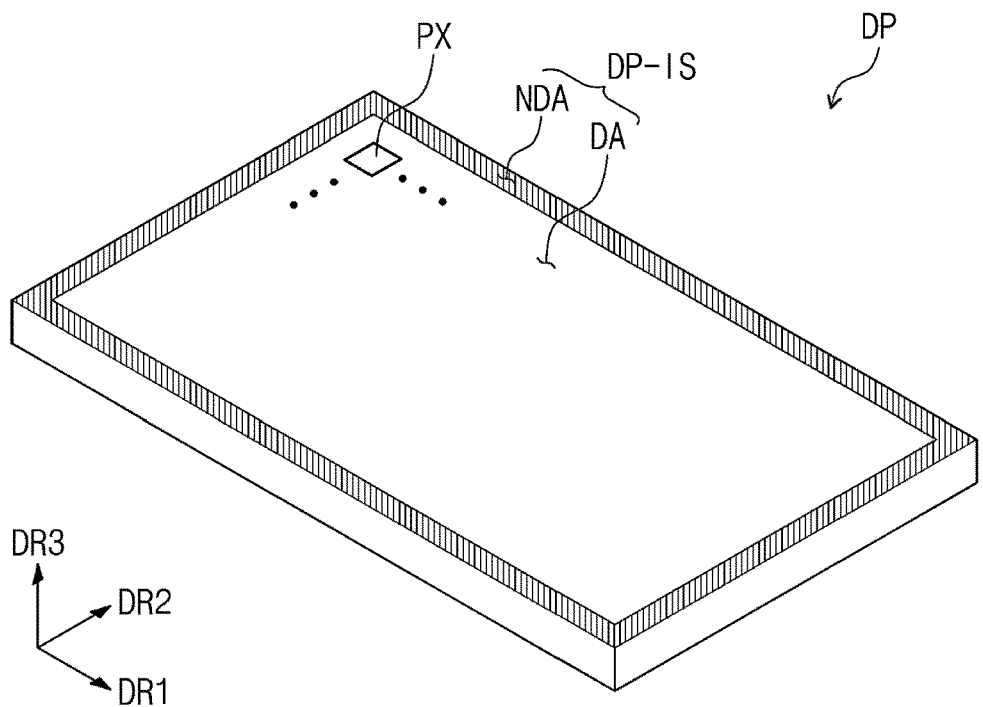
FIG. 1A is a perspective view illustrating a display panel according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
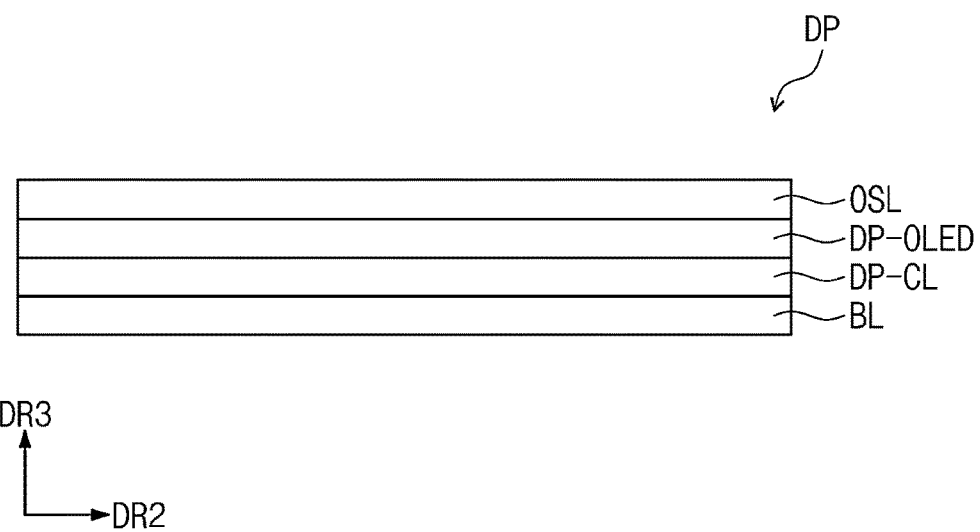
FIG. 1B is a cross-sectional view illustrating a display panel according to an embodiment of the inventive concept.
Figure 1C:
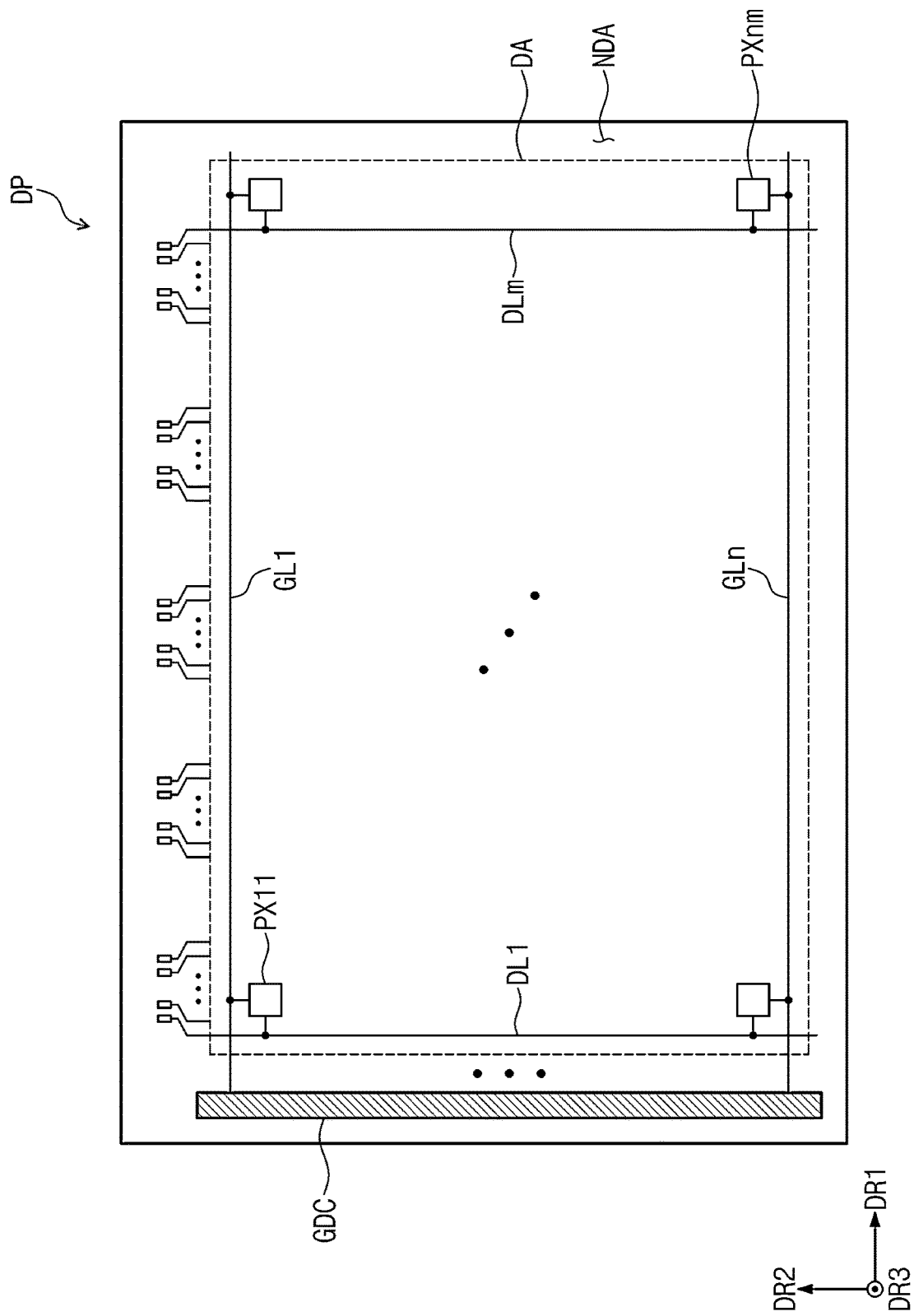
FIG. 1C is a plan view illustrating a display panel according to an embodiment of the inventive concept.

FIG. 1A is a perspective view illustrating a display panel DP according to an embodiment of the inventive concept. FIG. 1B is a cross-sectional view illustrating the display panel DP according to an embodiment of the inventive concept. FIG. 1C is a plan view illustrating the display panel DP according to an embodiment of the inventive concept.

As shown in FIG. 1A, the display panel DP may include a display surface DP-IS displaying an image. The display surface DP-IS may be parallel to a plane defined by a first direction axis DR1 and a second direction axis DR2. The display surface DP-IS may include a display region DA and a non-display region NDA. A pixel PX may be disposed in the display region DA but may not be disposed in the non-display region NDA. The non-display region NDA may be defined along an edge of the display surface DP-IS. The non-display region NDA may enclose the display region DA. In an embodiment, the non-display region NDA may be omitted or may be locally disposed near one side portion of the display region DA.

A direction normal to the display surface DP-IS (i.e., a thickness direction of the display panel DP) will be referred to as a third direction axis DR3. The third direction DR3 may be used to differentiate a front or top surface of each element (e.g., a layer or a unit) from a back or bottom surface. However, the first to third direction axes DR1, DR2, and DR3 illustrated in the present embodiment may be just an example. Hereinafter, first to third directions may be directions indicated by the first to third direction axes DR1, DR2, and DR3, respectively, and will be identified with the same reference numbers.

In an embodiment, the display panel DP is illustrated to have a flat-type display surface DP-IS, but the inventive concept is not limited to this example. The display panel DP may have a curved or three-dimensional display surface in an embodiment. The three-dimensional display surface may include a plurality of display regions, which are oriented in different directions.

As shown in FIG. 1B, the display panel DP may include a base layer BL, a circuit element layer DP-CL, a display element layer DP-OLED, and an optical structure layer OSL. The base layer BL may include a synthetic resin substrate or a glass substrate. The circuit element layer DP-CL may include at least one insulating layer and a circuit element. The circuit element may include signal lines, a pixel driving circuit, and so forth. The formation of the circuit element layer DP-CL may include forming an insulating layer, a semiconductor layer, and a conductive layer using a coating or deposition process and patterning the insulating layer, the semiconductor layer, and the conductive layer using a photolithography and/or etching process. The display element layer DP-OLED may include at least a display element. The optical structure layer OSL may convert a color of light, which is provided from the display element. The optical structure layer OSL may include a light-conversion pattern and a structure for increasing the optical conversion efficiency of the display panel.

FIG. 1C illustrates the arrangement of signal lines GL1 to GLn and DL1 to DLm and pixels PX11 to PXnm viewed in a plan view. The signal lines GL1 to GLn and DL1 to DLm may include a plurality of gate lines GL1 to GLn and a plurality of data lines DL1 to DLm.

Each of the pixels PX11 to PXnm may be connected to a corresponding one of the gate lines GL1 to GLn and a corresponding one of the data lines DL1 to DLm. Each of the pixels PX11 to PXnm may include a pixel driving circuit and a display element. According to the structure of the pixel driving circuit of the pixels PX11 to PXnm, signal lines of other types may be further provided in the display panel DP.

An example, in which the pixels PX11 to PXnm are arranged in a matrix shape, is illustrated in FIG. 1C, but the inventive concept is not limited to this example. The pixels PX11 to PXnm may be arranged in a pentile matrix shape in an embodiment. For example, the pixels PX11 to PXnm may be disposed at vertices of a diamond structure. A gate driving circuit GDC may be integrated on the display panel DP through an oxide silicon gate ("OSG") driver circuit process or an amorphous silicon gate ("ASG") driver circuit process.

Figure 2A:
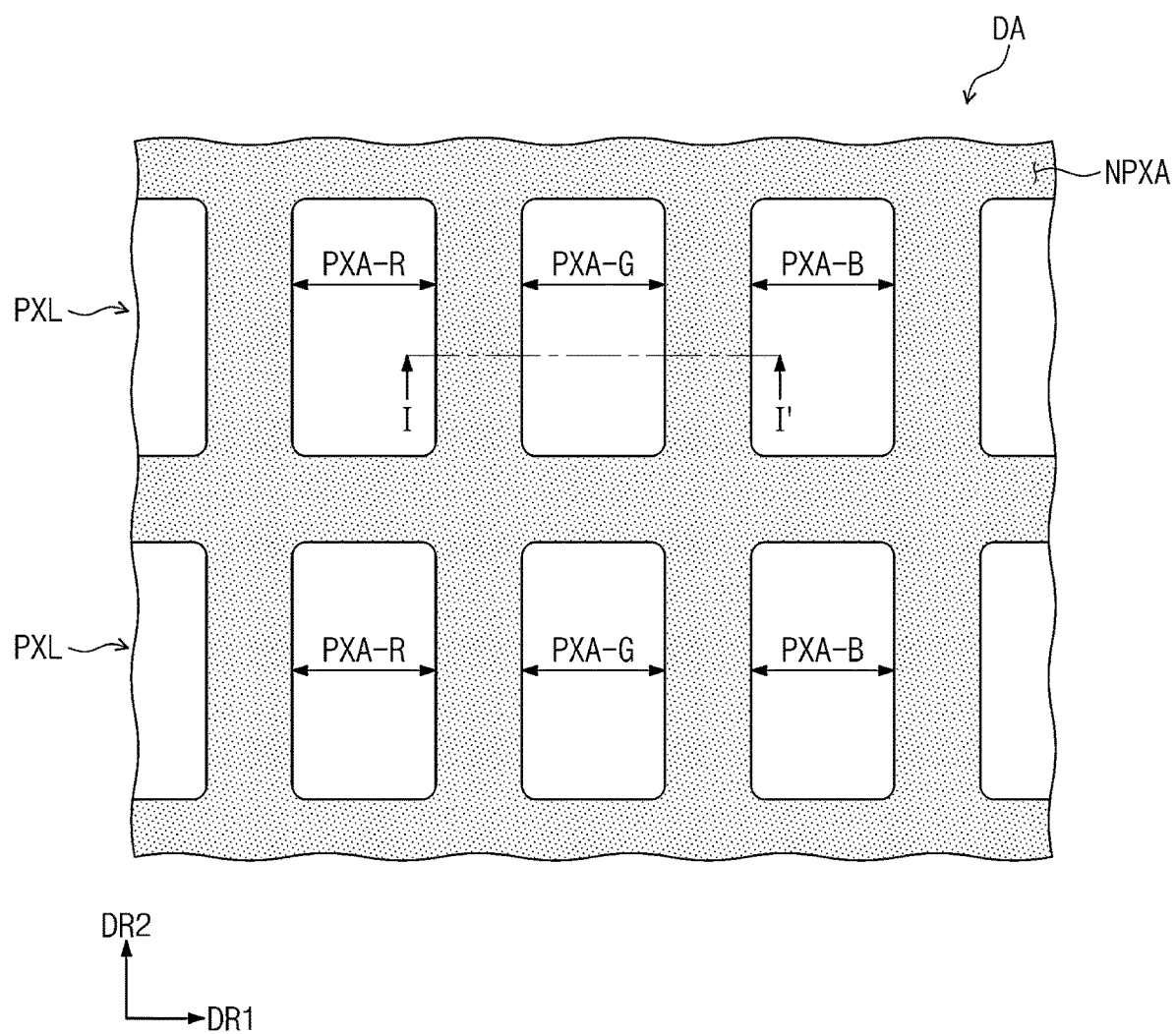
FIG. 2A is an enlarged plan view illustrating a display panel according to an embodiment of the inventive concept.
Figure 2B:
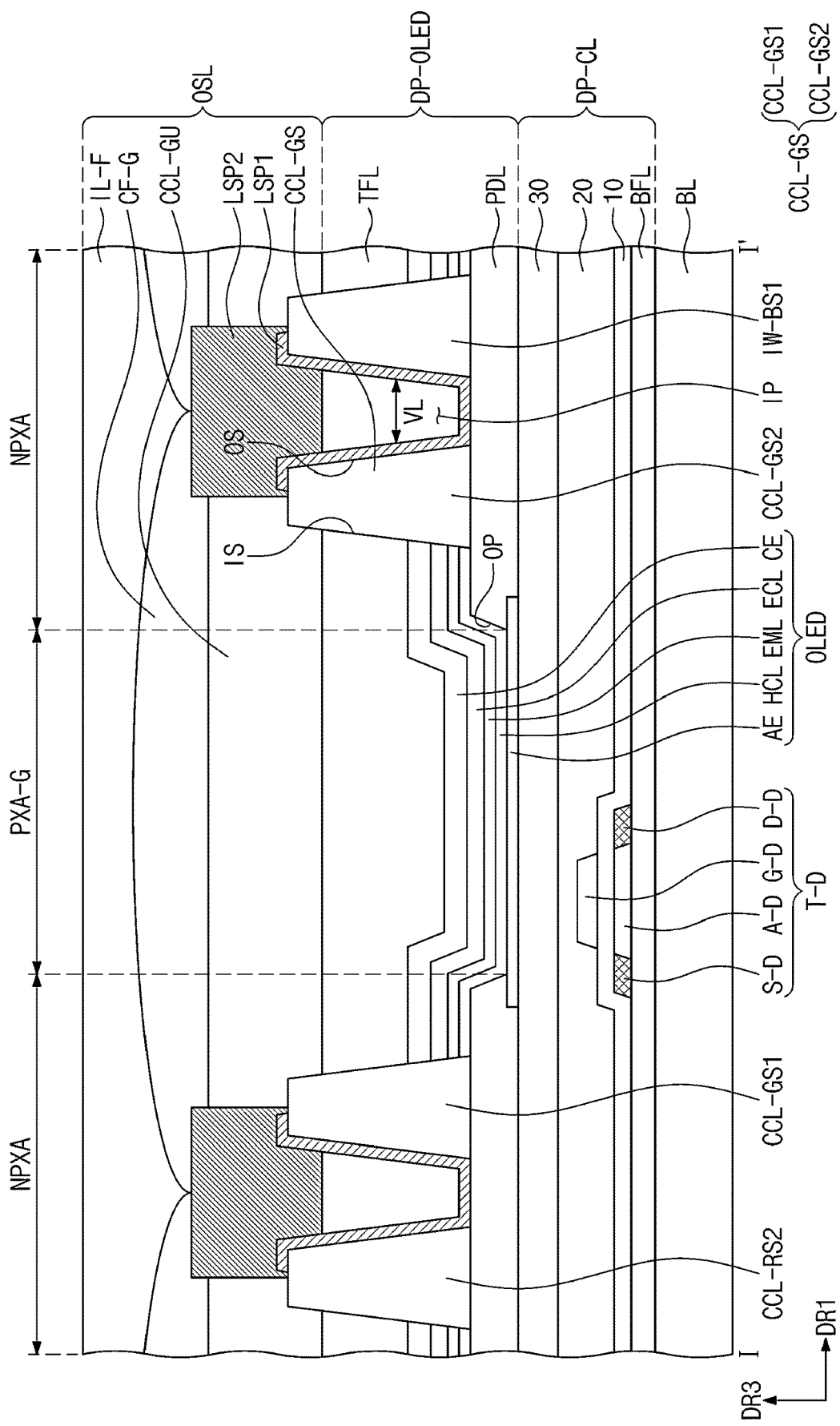
FIG. 2B is a cross-sectional view illustrating a display panel according to an embodiment of the inventive concept.

FIG. 2A is an enlarged plan view illustrating the display panel DP according to an embodiment of the inventive concept. FIG. 2B is a cross-sectional view illustrating the display panel DP according to an embodiment of the inventive concept.

FIG. 2A exemplarily illustrates six pixel regions PXA-R, PXA-G, and PXA-B, which are included in two pixel rows PXL. FIG. 2B illustrates a cross-section corresponding to a line of FIG. 2A. In the present embodiment, three kinds of the pixel regions PXA-R, PXA-G, and PXA-B shown in FIG. 2A may be repeatedly disposed throughout the display region DA (e.g., see FIG. 1A).

A peripheral region NPXA may be disposed around the first to third pixel regions PXA-R, PXA-G, and PXA-B. The peripheral region NPXA may delimit the first to third pixel regions PXA-R, PXA-G, and PXA-B. The peripheral region NPXA may enclose the first to third pixel regions PXA-R, PXA-G, and PXA-B. A structure of preventing a color-mixing issue between the first to third pixel regions PXA-R, PXA-G, and PXA-B may be disposed in the peripheral region NPXA.

In the present embodiment, the first to third pixel regions PXA-R, PXA-G, and PXA-B are illustrated to have the same planar area, but the inventive concept is not limited to this example. At least two regions of the first to third pixel regions PXA-R, PXA-G, and PXA-B may have different areas from each other. The areas of the first to third pixel regions PXA-R, PXA-G, and PXA-B may be determined in consideration of colors of emission lights. A pixel region emitting a red light, which is one of primary colors, may have the largest area, and a pixel region emitting a blue light may have the smallest area.

When viewed in a plan view, the first to third pixel regions PXA-R, PXA-G, and PXA-B are illustrated to have corner regions having a rounded or substantially rectangular shape, but the inventive concept is not limited to this example. When viewed in a plan view, the first to third pixel regions PXA-R, PXA-G, and PXA-B may have other polygonal shapes, such as diamond, pentagonal, and substantially polygonal shapes in an embodiment.

One of the first to third pixel regions PXA-R, PXA-G, and PXA-B may provide a third color light corresponding to the source light, another may provide a first color light that is different from the third color light, and the other may provide a second color light that is different from the first and third color lights. In the present embodiment, the third pixel region PXA-B may provide a third color light. In the present embodiment, the first pixel region PXA-R may provide a red light, the second pixel region PXA-G may provide a green light, and the third pixel region PXA-B may provide a blue light.

Referring to FIG. 2B, the circuit element layer DP-CL may include a transistor T-D serving as a circuit element. The structure of the circuit element layer DP-CL may vary depending on the design of the driving circuit of the pixel PX (e.g., see FIG. 1), and one transistor T-D is exemplarily illustrated in FIG. 2B. An example disposition of an active region A-D, a source S-D, a drain D-D, a gate G-D which constitute the transistor T-D is illustrated in FIG. 2B. The active region A-D, the source S-D, and the drain D-D may be differentiated according to a doping concentration or conductivity of a semiconductor pattern.

The circuit element layer DP-CL may include a buffer layer BFL, a first insulating layer 10, a second insulating layer 20, and a third insulating layer 30, which are disposed on the base layer BL. For example, the buffer layer BFL, the first insulating layer 10, and the second insulating layer 20 may be inorganic layers, and the third insulating layer 30 each may be an organic layer.

The display element layer DP-OLED may include an emission element OLED serving as a display element. The emission element OLED may generate the source light described above. The emission element OLED may include a first electrode AE, a second electrode CE, and an emission layer EML disposed therebetween. In the present embodiment, the display element layer DP-OLED may include an organic light emitting diode serving as an emission element. In an embodiment, the emission element may include a quantum dot light-emitting diode.

The display element layer DP-OLED may include a pixel definition layer PDL. For example, the pixel definition layer PDL may be an organic layer.

The first electrode AE may be disposed on the third insulating layer 30. The first electrode AE may be directly or indirectly connected to the transistor T-D, although the connection structure between the first electrode AE and the transistor T-D is not shown in FIG. 2B. An opening OP may be defined in the pixel definition layer PDL. The opening OP defined in the pixel definition layer PDL may expose at least a portion of the first electrode AE. In the present embodiment, the opening OP may define the pixel region PXA-G.

A hole control layer HCL, the emission layer EML, and an electron control layer ECL may be overlapped with at least the pixel region PXA-G. The hole control layer HCL, the emission layer EML, the electron control layer ECL, and the second electrode CE may be disposed in each of the first to third pixel regions PXA-R, PXA-G, and PXA-B (e.g., see FIG. 2A). In an embodiment, each of the hole control layer HCL, the emission layer EML, the electron control layer ECL, and the second electrode CE, which are overlapped with the first to third pixel regions PXA-R, PXA-G, and PXA-B, may be provided as a single body. In an embodiment, at least one of the hole control layer HCL, the emission layer EML, and the electron control layer ECL may include a plurality of patterns, which are disposed in the first to third pixel regions PXA-R, PXA-G, and PXA-B, respectively.

The hole control layer HCL may include a hole transport layer and, in an embodiment, the hole control layer HCL may further include a hole injection layer. In an embodiment, the emission layer EML may generate a blue light. The blue light may have a wavelength ranging from about 410 nanometers (nm) to about 480 nm. A light-emitting spectrum of the blue light may have a high peak within a wavelength range of about 440 nm to about 460 nm. The electron control layer ECL may include an electron transport layer. In an embodiment, the electron control layer ECL may further include an electron injection layer.

The display element layer DP-OLED may include an upper insulating layer TFL protecting the second electrode CE. The upper insulating layer TFL may be formed of or include at least one of organic or inorganic materials. The upper insulating layer TFL may have a multi-layered structure, in which an inorganic layer and an organic layer are repeatedly provided. The upper insulating layer TFL may include a thin sealing structure including an inorganic layer, an organic layer, and an inorganic layer with this order. The upper insulating layer TFL may further include a refractive index control layer for improving light-emitting efficiency.

Figure 4A:
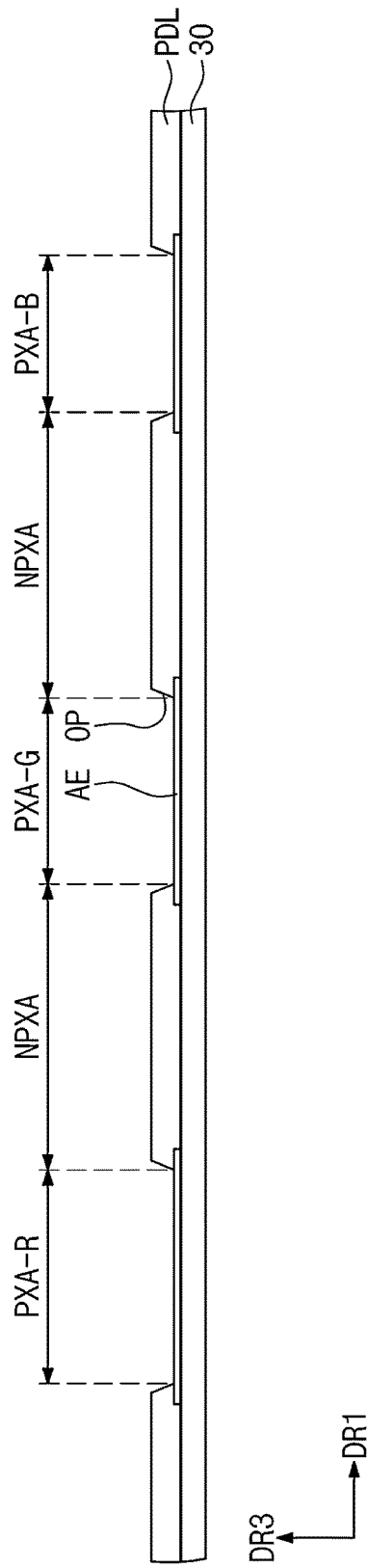
FIGS. 4A to 4I are cross-sectional views exemplarily illustrating a process of fabricating a display panel, according to an embodiment of the inventive concept.
Figure 4B:
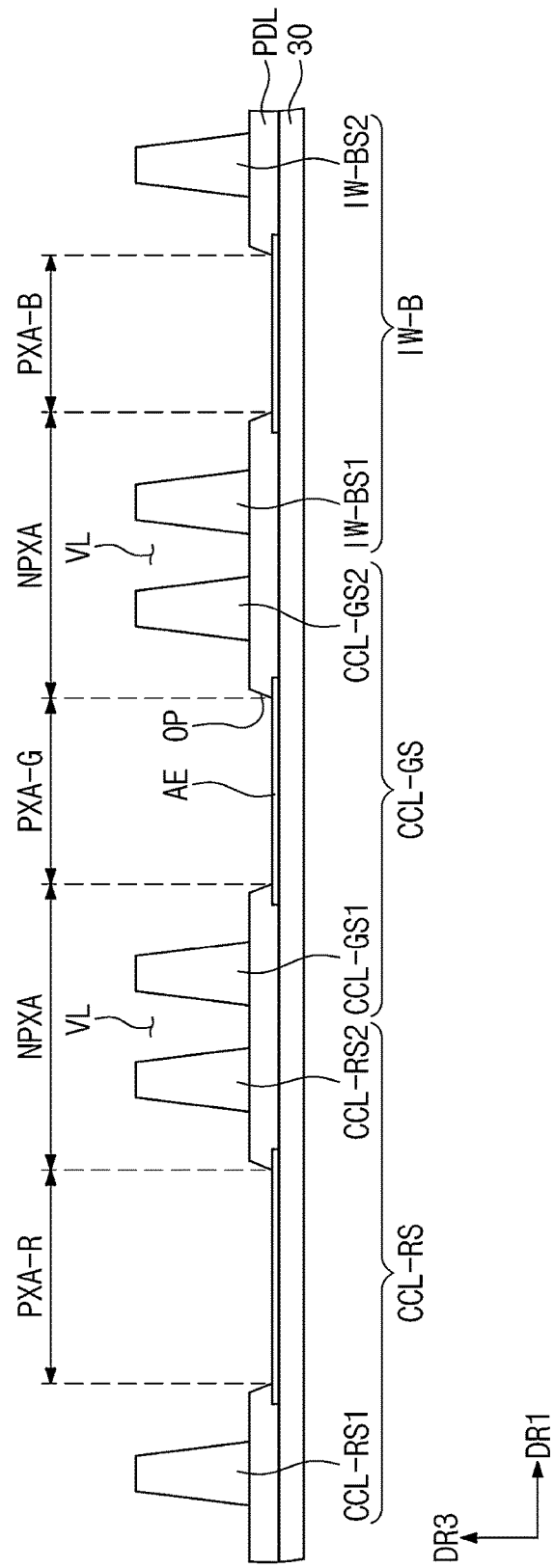
Figure 4C:
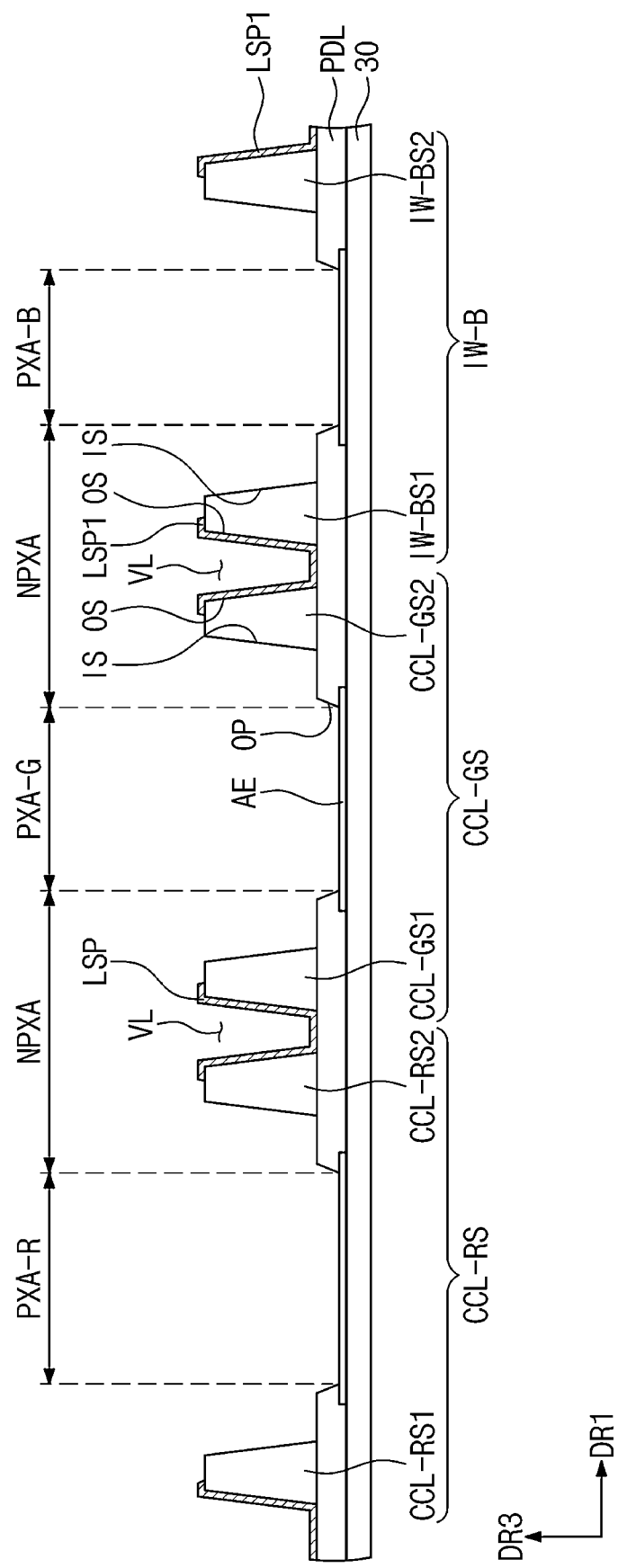
Figure 4D:
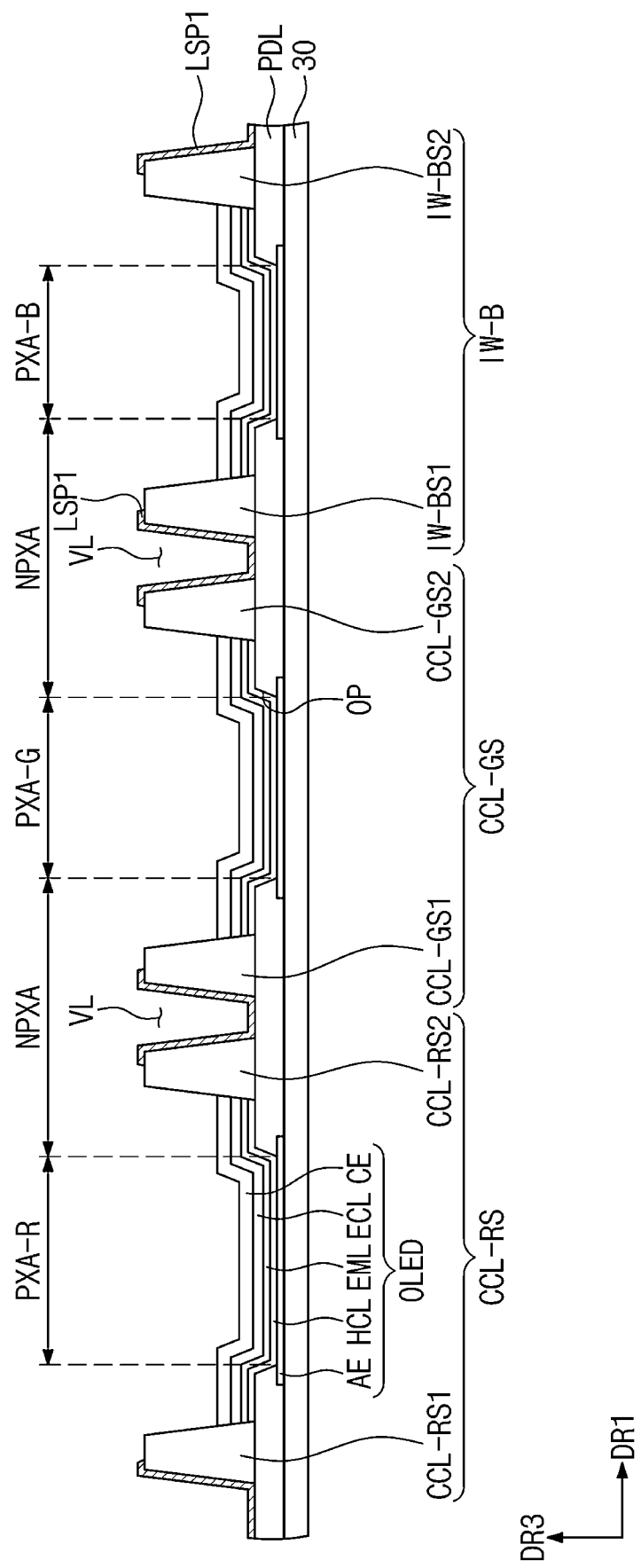
Figure 4E:
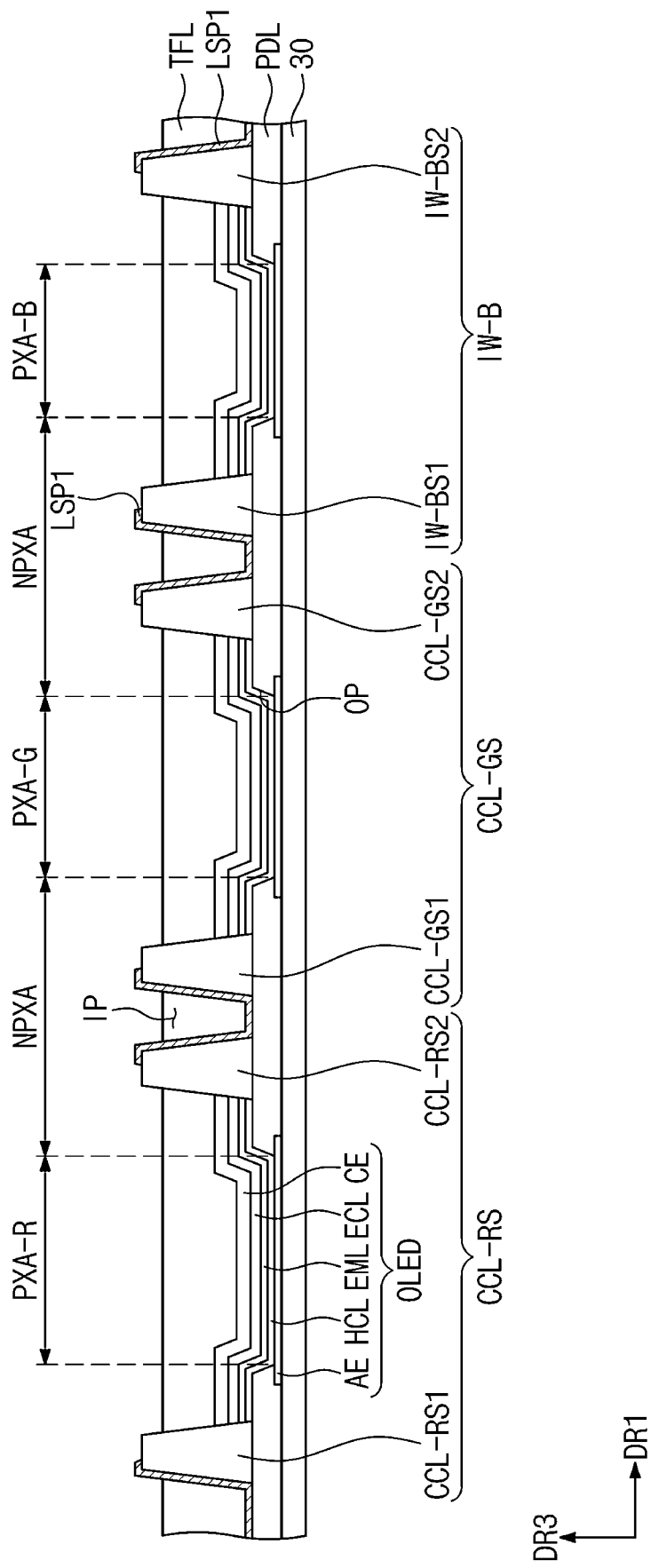
Figure 4F:
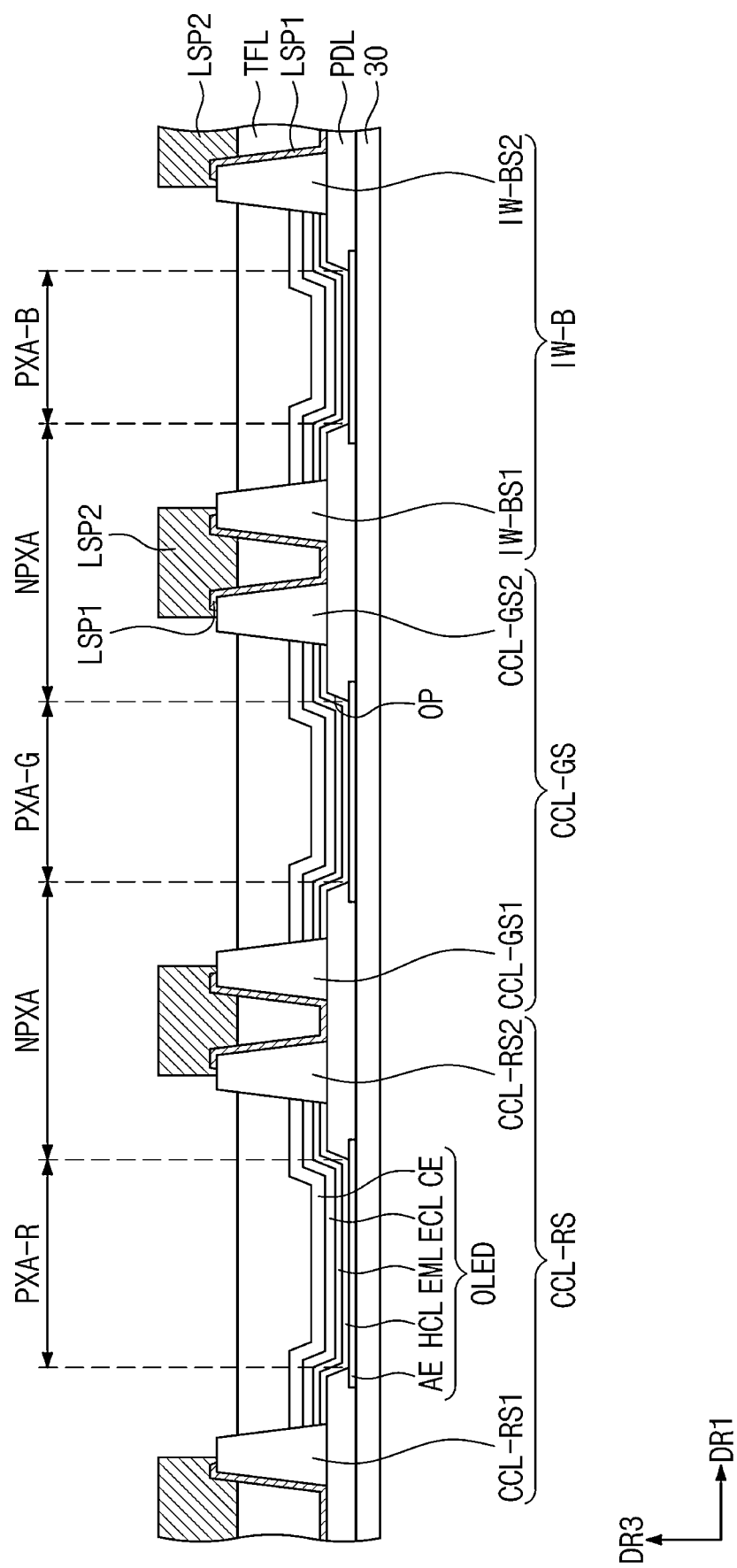
Figure 4G:
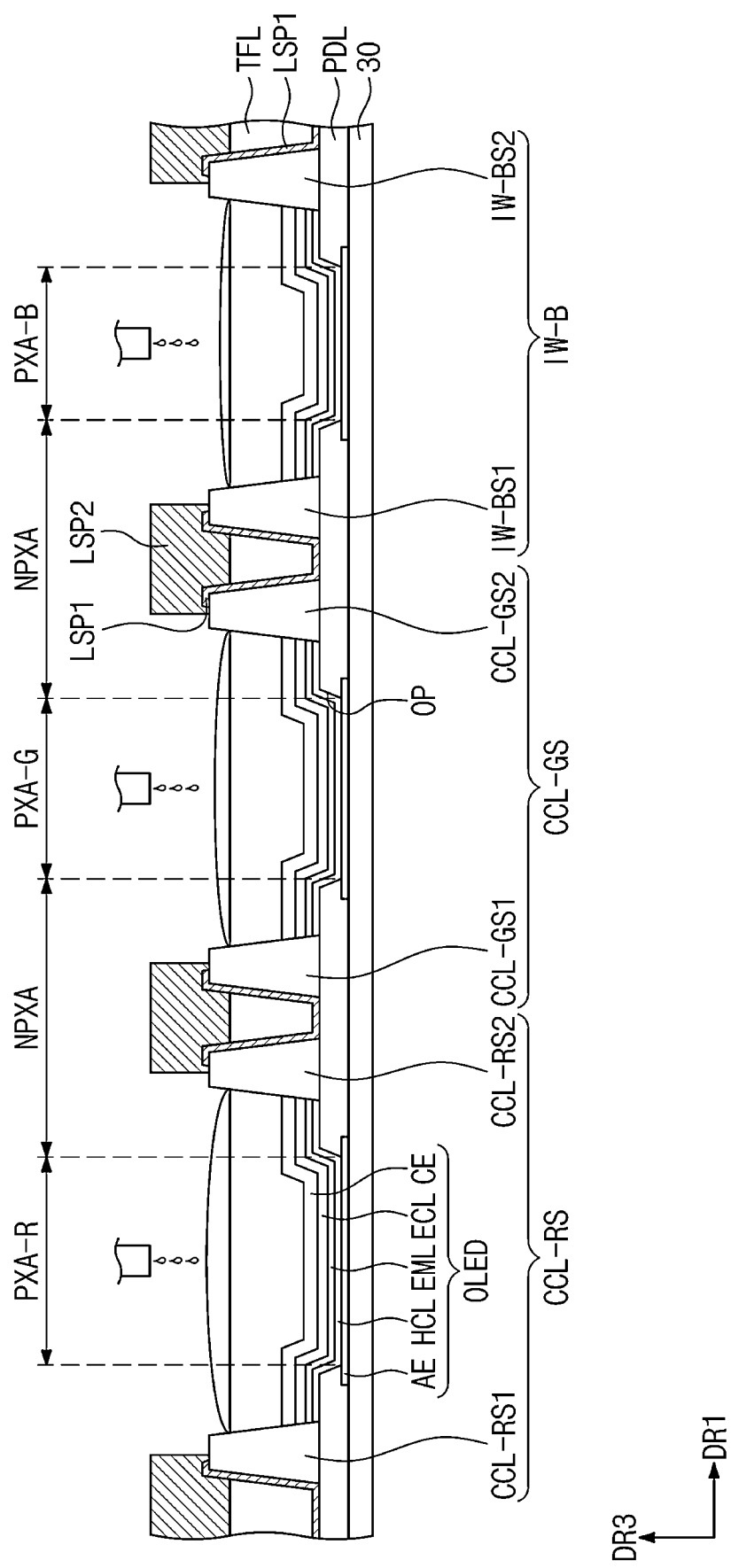
Figure 4H:
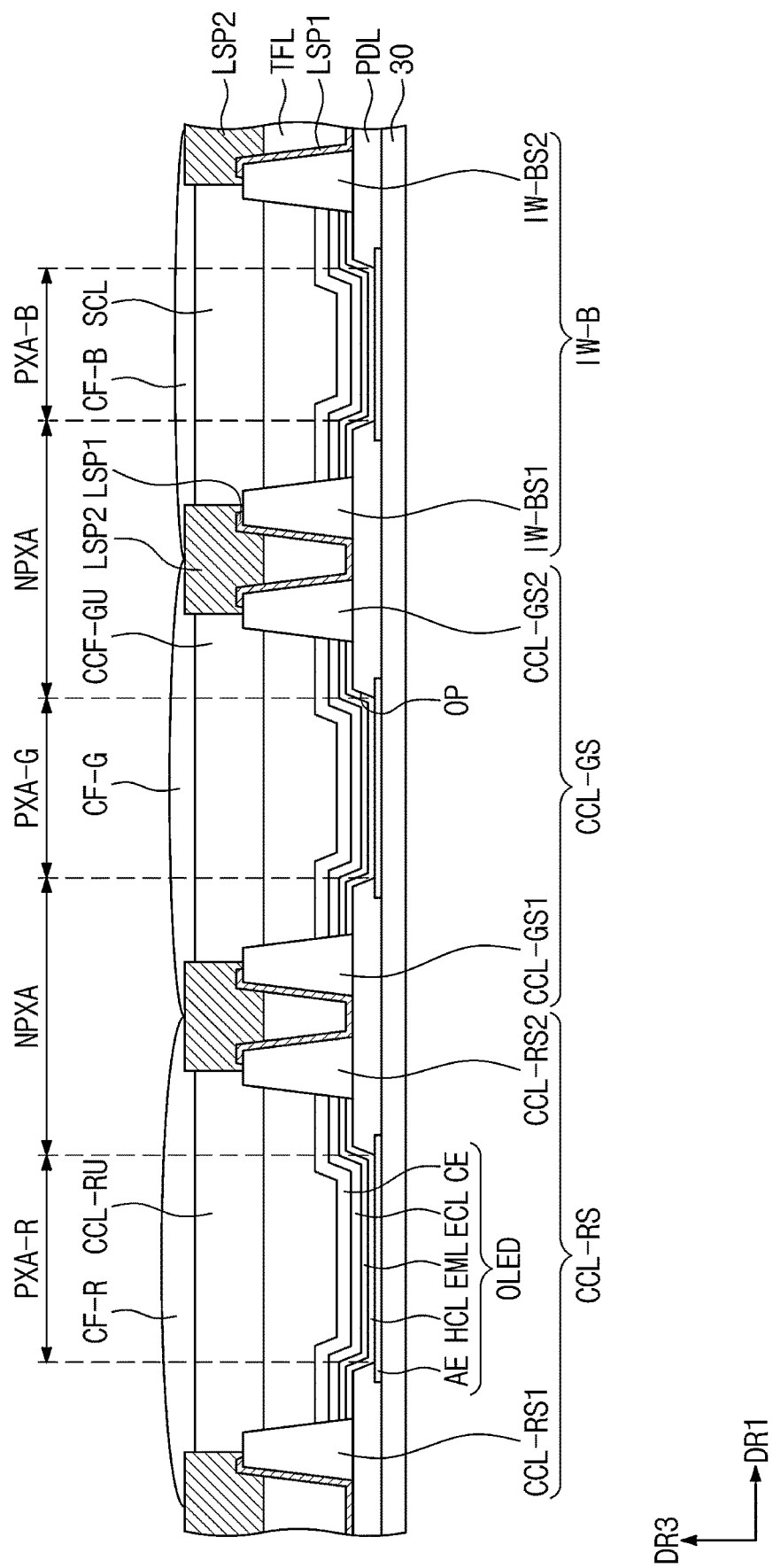
Figure 4I:
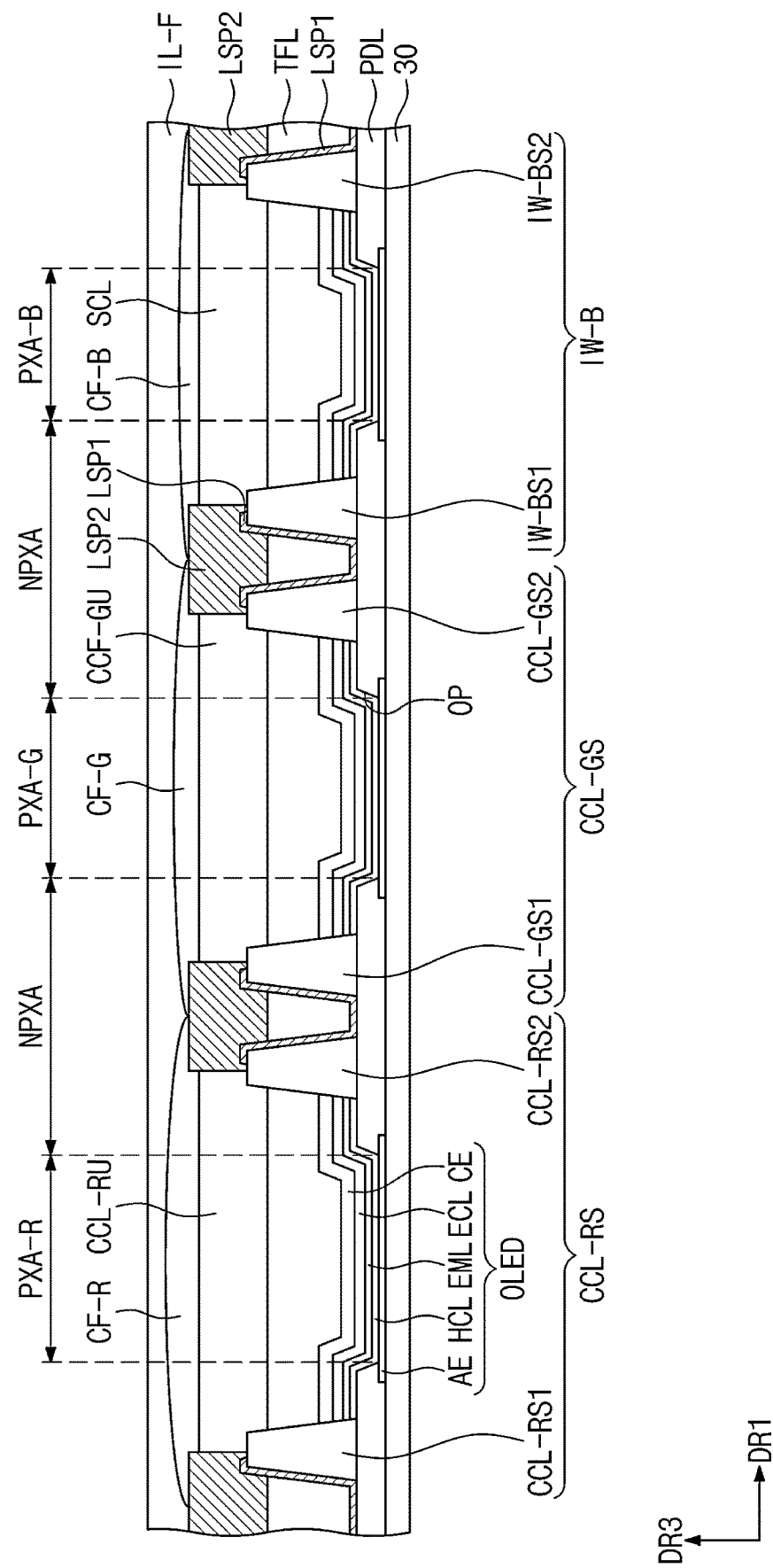

The optical structure layer OSL may include a first light-conversion pattern (a collective name of a first green light-conversion pattern CCL-GS and a first red light-conversion pattern CCL-RS, See FIG. 4I), a second light-conversion pattern (a collective name of a second green light-conversion pattern CCL-GU and a second red light-conversion pattern CCL-RU, See FIG. 4I), and a first light-blocking pattern LSP1.

Referring to FIG. 2B, the first light-conversion pattern CCL-GS may be disposed on the pixel definition layer PDL. Even though the first light-conversion pattern CCL-GS is illustrated to be in contact with the pixel definition layer PDL in the figures, but the inventive concept is not limited to this example. In an embodiment, for example, an additional layer may be disposed between the pixel definition layer PDL and the first light-conversion pattern CCL-GS.

The first light-conversion pattern CCL-GS may include a plurality of sub-light-conversion patterns. The sub-light-conversion patterns may be disposed outside the opening OP, when viewed in a plan view. Since, when viewed in a plan view, the first light-conversion pattern CCL-GS is not overlapped with the emission element OLED, the first light-conversion pattern CCL-GS may be defined as a lateral light-conversion pattern.

The sub-light-conversion patterns may include a first sub-light-conversion pattern CCL-GS1 and a second sub-light-conversion pattern CCL-GS2, which are disposed at opposite sides of the first electrode AE, when viewed in a cross-sectional view.

The upper insulating layer TFL may be disposed between the first and second sub-light-conversion patterns CCL-GS1 and CCL-GS2. The upper insulating layer TFL may be in contact with inner side surfaces IS of the first and second sub-light-conversion patterns CCL-GS1 and CCL-GS2. Here, the inner side is a side facing the emission element OLED, and an outer side is a side opposite to the inner side.

The second light-conversion pattern CCL-GU may be disposed on the emission element OLED and may be overlapped with the emission element OLED, when viewed in a plan view. Since the second light-conversion pattern CCL-GU is overlapped with the emission element OLED in the plan view, the second light-conversion pattern CCL-GU may be defined as a front light-conversion pattern.

The second light-conversion pattern CCL-GU may be disposed on the upper insulating layer TFL, and a width of the first electrode AE of the emission element OLED in the first direction DR1 may be smaller than a width of the second light-conversion pattern CCL-GU in the first direction DR1.

Since the second light-conversion pattern CCL-GU is formed by a process different from the manufacturing process for the first light-conversion pattern CCL-GS, the second light-conversion pattern CCL-GU may be spaced apart from the first light-conversion pattern CCL-GS or an interface may be formed between the first and second light-conversion patterns CCL-GS and CCL-GU. FIG. 2B illustrates an example, in which a portion of the second light-conversion pattern CCL-GU is in contact with the first light-conversion pattern CCL-GS to form an interface therebetween. In the case where an insulating layer or an insulating pattern is disposed between the first and second light-conversion patterns CCL-GS and CCL-GU, the second light-conversion pattern CCL-GU may be spaced apart from the first light-conversion pattern CCL-GS.

The first and second light-conversion patterns CCL-GS and CCL-GU may absorb a source light, which is generated from the emission element OLED, and then may generate light whose color is different from that of the source light. Lights emitted from the first and second light-conversion patterns CCL-GS and CCL-GU may generate substantially the same color light.

Each of the first and second light-conversion patterns CCL-GS and CCL-GU may include a base resin and quantum dots dispersed (or mixed) in the base resin. The first and second light-conversion patterns CCL-GS and CCL-GU may include the same quantum dot. The base resin may be a medium material, in which the quantum dots are dispersed, and may be made of at least one of various resin composites which are called "binder" generally.

However, the inventive concept is not limited to this example, and in the present specification, if the quantum dots can be dispersed in a medium material, the medium material may be referred to as a base resin, regardless of its name, additional function, or constituents. The base resin may be a polymer resin. In an embodiment, for example, the base resin may be acrylic resins, urethane resins, silicone resins, and/or epoxy resins. The base resin may be transparent.

Quantum dots may be particles causing a change in wavelength of an incident light. Each of the quantum dots may have a nanometer-order crystalline material consisting of hundreds to thousands of atoms and may exhibit an increase in band gap, due to its small size and the consequent quantum confinement effect. In the case where an energy of light incident to the quantum dots is larger than a band gap of the quantum dots, each of the quantum dots may absorb the light to transition to an excited state, and then, may emit light of a specific wavelength when returning to its ground state. The wavelength of the emitted light may be determined by the band gap. That is, by adjusting sizes or compositions of the quantum dots, it may be possible to control the quantum confinement effect and the light-emitting characteristics of the optical structure layer OSL.

The quantum dot may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The compounds may be selected from the group consisting of ternary compounds (e.g., including AgInS2, CuInS2, AgGaS2, and CuGaS2), mixtures of the ternary compounds, quaternary compounds (e.g., including AgInGaS2 and CuInGaS2), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InNP, InNAs, InNSb, InPAs, and InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds. In an embodiment, the III-V compounds may further include one of the group II metals. For example, InZnP or the like may be selected as such a III-II-V compound.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and combination thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle.

The quantum dots may be a core-shell structure including a core and a shell enclosing the core. In an embodiment, the quantum dots may have a core/shell structure, in which one quantum dot is enclosed by another quantum dot. At an interface between the core and the shell, an element contained in the shell may have a concentration gradient decreasing in a central direction.

Each of the quantum dots may be a nanometer-scale particle. Each of the quantum dots may have a light-emitting wavelength spectrum whose full width half maximum ("FWHM") is less than about 45 nm (in particular, less than about 40 nm or in more particular, less than about 30 nm), and in this case, it may be possible to improve color purity or color reproduction characteristics. Furthermore, the quantum dots may allow light to be emitted radially, and thus, it may be possible to improve a viewing angle property.

In an embodiment, the quantum dots may be a spherical, pyramid-shaped, multi-arm, or cubic nano particle. In an embodiment, the quantum dots may be a nano tube, a nano wire, a nano fiber, or a nano plate-shaped particle, but the inventive concept is not limited to these examples. A wavelength or color of the light emitted from the quantum dot may be determined by a particle size of the quantum dot, and thus, in the case where the quantum dots are provided in various sizes, lights converted by the quantum dots may have various colors (e.g., red, green, and blue).

The first light-blocking pattern LSP1 may be disposed outside the first and second sub-light-conversion patterns CCL-GS1 and CCL-GS2, in the first direction DR1. The first light-blocking pattern LSP1 may prevent a part of a source light, which is not converted by the light-conversion pattern, from being leaked into a neighboring pixel region (e.g., PXA-R and PXA-B; see FIG. 2A).

The first light-blocking pattern LSP1 may be in contact with outer side surfaces OS of the first and second sub-light-conversion patterns CCL-GS1 and CCL-GS2. In the present embodiment, the first light-blocking pattern LSP1 may include a metal layer. The metal layer may include a metallic material having high reflectance. For example, the metal layer may include a metallic material (e.g., aluminum). The non-converted part of the source light, which is incident into the first light-conversion pattern CCL-GS, may be reflected by the metal layer and may be again provided to the quantum dots in the first light-conversion pattern CCL-GS. Accordingly, it may be possible to improve the optical conversion efficiency of the display panel. The metal layer may define an inclined surface corresponding to the outer side surface OS.

One of the first light-blocking patterns LSP1 may be disposed between a pair of the first sub-light-conversion pattern CCL-GS1 and other sub-light-conversion pattern (e.g., the second sub-light-conversion pattern CCL-RS2 of the first red light-conversion pattern CCL-RS) which are adjacent to each other. Another of the first light-blocking patterns LSP1 may be disposed between a pair of the second sub-light-conversion pattern CCL-GS2 and a first sub-insulating partition wall IW-BS1 which are adjacent to each other.

Valleys VL may be defined between the adjacent pair of the first sub-light-conversion pattern CCL-GS1 and the second sub-light-conversion pattern CCL-RS2 and between the adjacent pair of the second sub-light-conversion pattern CCL-GS2 and the first sub-insulating partition wall IW-BS1, respectively. The first light-blocking pattern LSP1 may maintain the valley VL. An insulating pattern IP, which is formed by the process of forming the upper insulating layer TFL, may be disposed on the first light-blocking pattern LSP1 in the valley VL. The insulating pattern IP may include a plurality of insulating layers, which have the same stacking structure as the upper insulating layer TFL. The second sub-light-conversion pattern CCL-RS2 and the first sub-insulating partition wall IW-BS1 will be described in more detail below.

The optical structure layer OSL may further include a second light-blocking pattern LSP2, which is disposed on the first light-blocking pattern LSP1. The second light-blocking pattern LSP2 may cover the first light-blocking pattern LSP1 such that the first light-blocking pattern LSP1 of the metal layer is not exposed to the outside when viewed in a plan view.

The second light-blocking pattern LSP2 may include a black coloring agent. The black coloring agent may include a black dye or a black pigment. The black coloring agent may include metallic materials, such as carbon black and chromium, or oxides thereof.

The optical structure layer OSL may further include a color filter CF-G, which is disposed on the second light-blocking pattern LSP2 and the second light-conversion pattern CCL-GU. The color filter CF-G may transmit the converted light and may block the source light which is not converted. The color filter CF-G may absorb a leakage light, which is leaked from a neighboring pixel region. The color filter CF-G may transmit a conversion light, which is converted from the source light by the first and second light-conversion patterns CCL-GS and CCL-GU.

The color filter CF-G may include a base resin and a dye and/or pigment dispersed in the base resin. The base resin may be a medium material, in which the dye and/or pigment is dispersed, and may be made of or include at least one of various resin composites, which are generally called "binder".

An insulating layer IL-F may be disposed on the color filter CF-G. The insulating layer IL-F may include an organic layer. The insulating layer IL-F may provide a flat top surface. The insulating layer IL-F may further include an inorganic layer (e.g., a hard coating layer) that is disposed on the flat top surface.

Figure 3A:
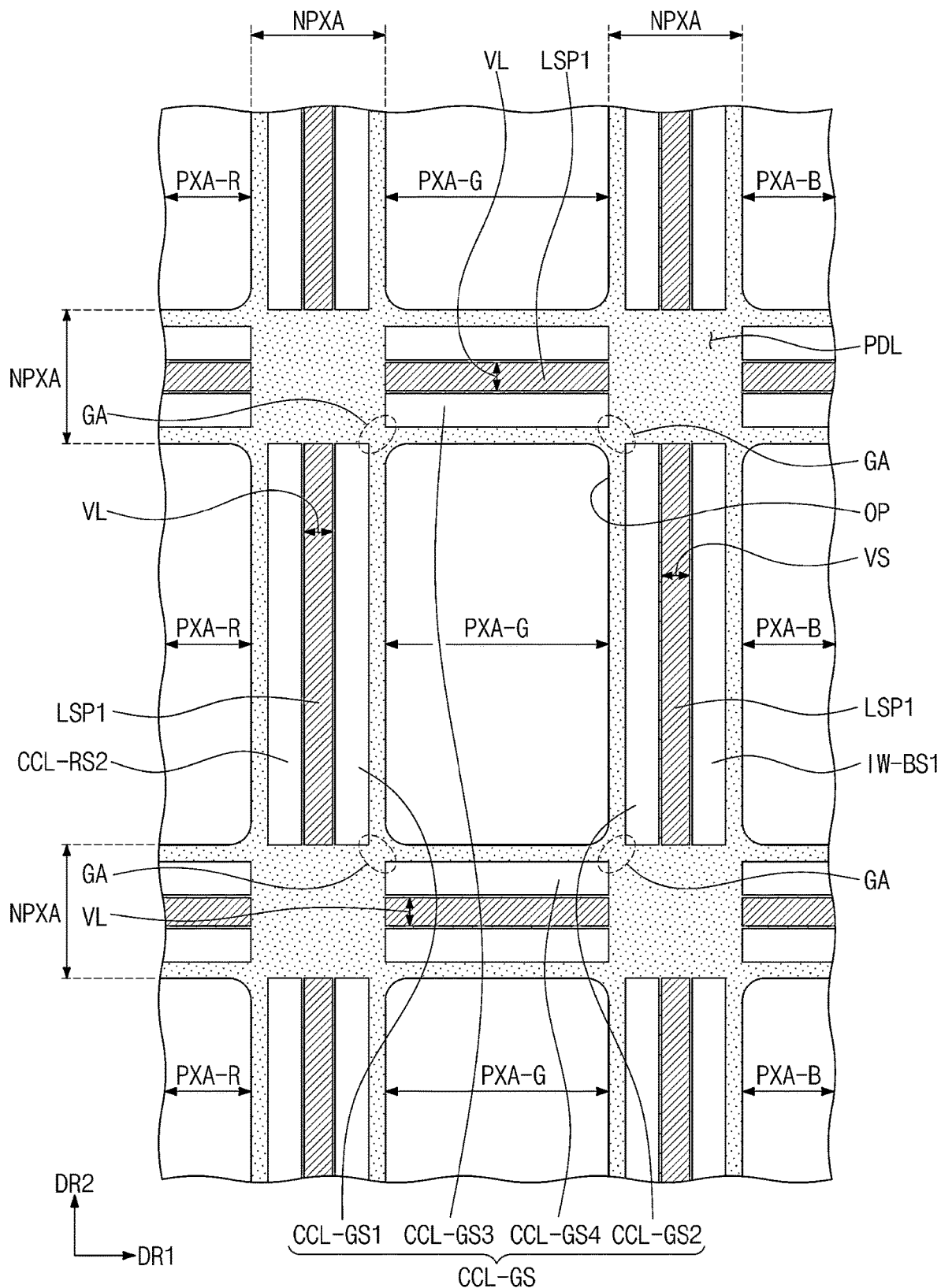
FIGS. 3A to 3C are enlarged plan views illustrating a display panel according to an embodiment of the inventive concept.
Figure 3B:
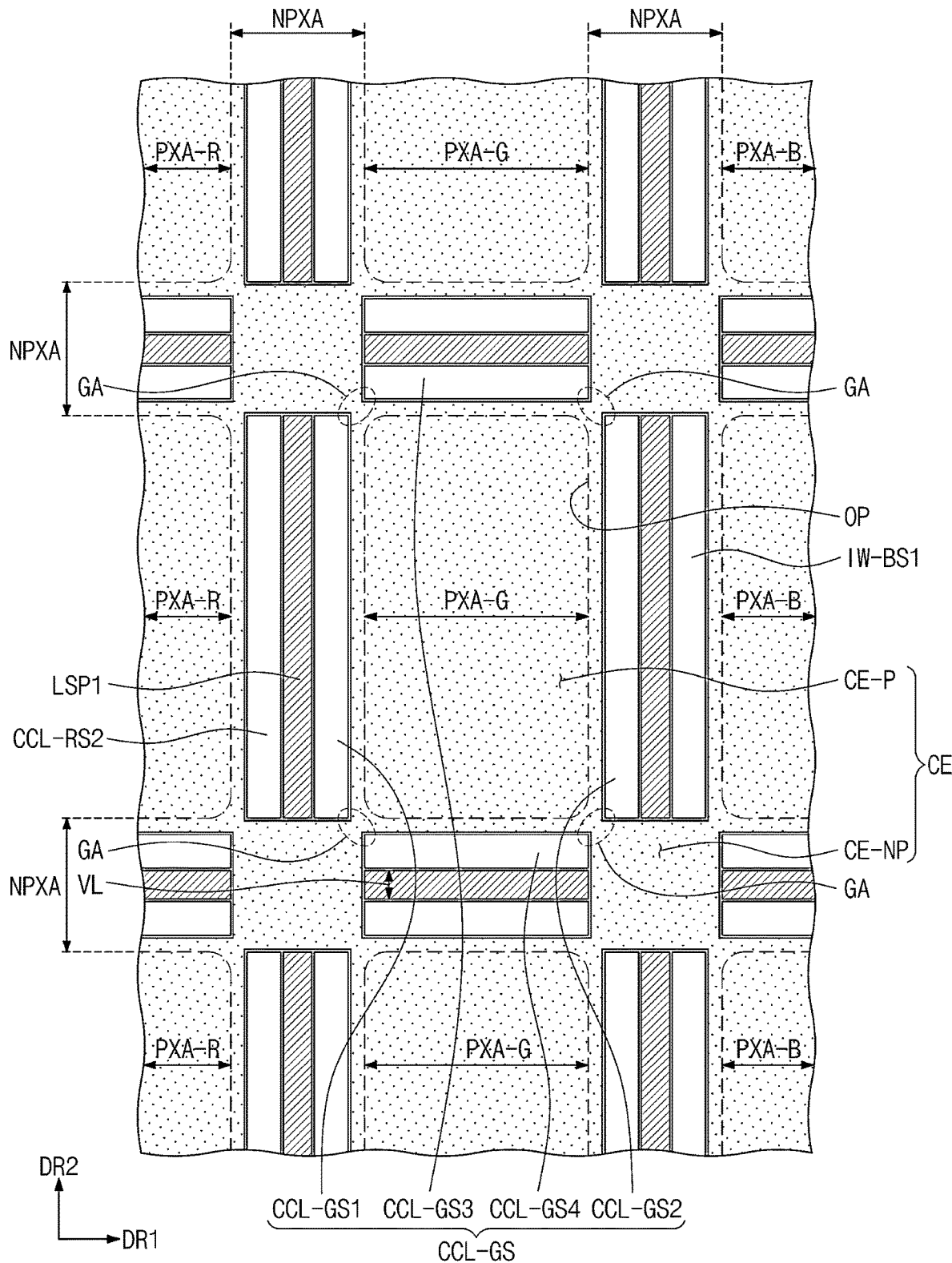
Figure 3C:
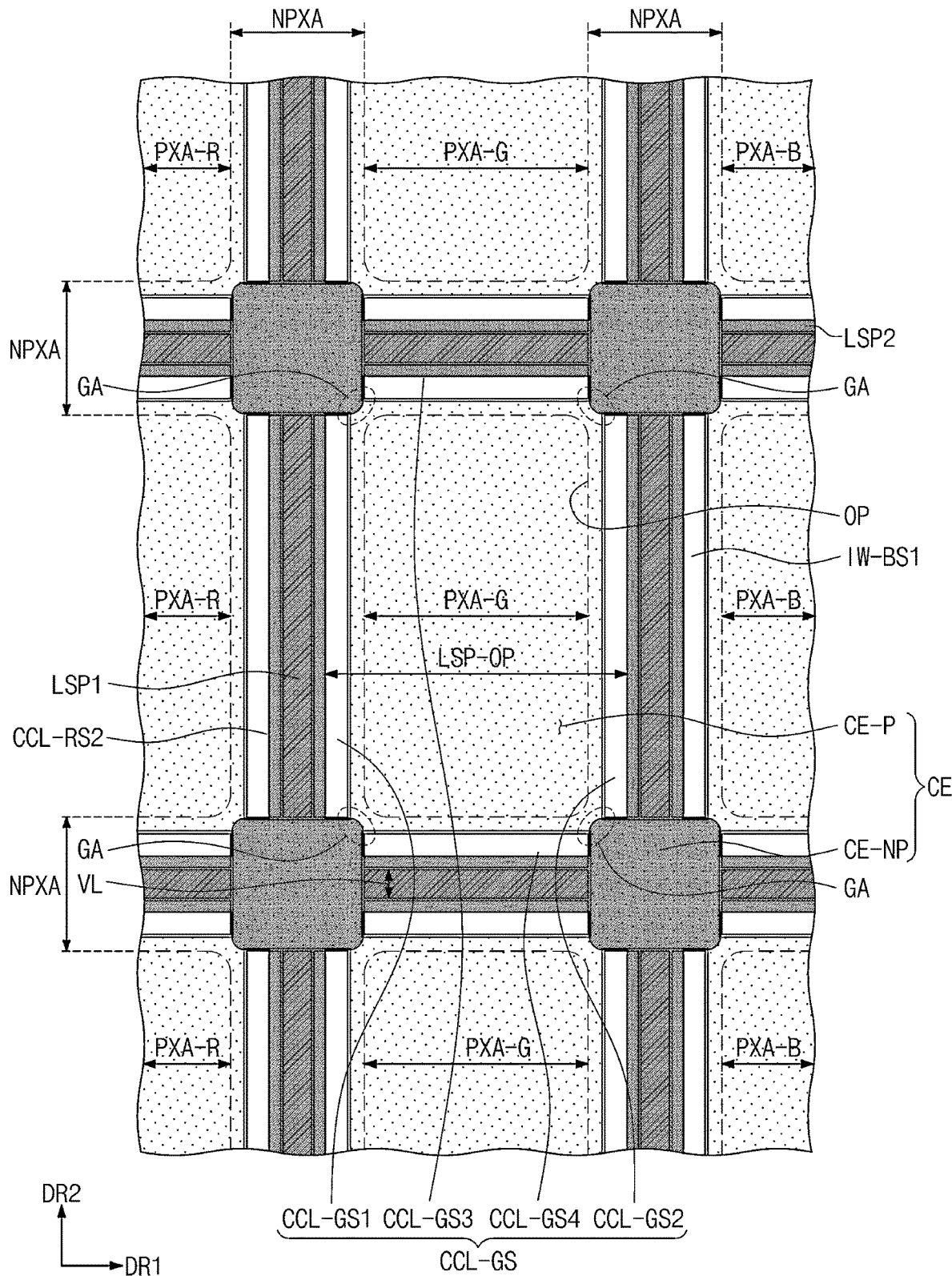

FIGS. 3A and 3B are enlarged plan views illustrating the display panel DP according to an embodiment of the inventive concept. FIGS. 3A and 3B illustrate an enlarged shape of a region, in which the three kinds of the pixel regions PXA-R, PXA-G, and PXA-B shown in FIG. 2A are included, and the second pixel region PXA-G is placed at a center. FIG. 3A illustrates some elements of the elements shown in FIG. 2B. FIG. 3B illustrates other elements of the elements shown in FIG. 2B. FIG. 3C illustrates still other elements of the elements shown in FIG. 2B.

As shown in FIG. 3A, the first light-conversion pattern CCL-GS may include the first sub-light-conversion pattern CCL-GS1, the second sub-light-conversion pattern CCL-GS2, a third sub-light-conversion pattern CCL-GS3, and a fourth sub-light-conversion pattern CCL-GS4, which are disposed outside the opening OP. The first and second sub-light-conversion patterns CCL-GS1 and CCL-GS2 may be extended in the second direction DR2 and may be spaced apart from each other in the first direction DR1. The first and second sub-light-conversion patterns CCL-GS1 and CCL-GS2 may be extended along a first edge of the pixel definition layer PDL defining the opening OP. The third and fourth sub-light-conversion patterns CCL-GS3 and CCL-GS4 may be extended in the first direction DR1 and may be spaced apart from each other in the second direction DR2. The third and fourth sub-light-conversion patterns CCL-GS3 and CCL-GS4 may be extended along a second edge of the pixel definition layer PDL defining the opening OP.

At least two pattens of the first, second, third, and fourth sub-light-conversion patterns CCL-GS1, CCL-GS2, CCL-GS3, and CCL-GS4, which are adjacent to each other, may be spaced apart from each other when viewed in a plan view. The first sub-light-conversion pattern CCL-GS1 may be spaced apart from at least one of the third and fourth sub-light-conversion patterns CCL-GS3 and CCL-GS4, when viewed in a plan view, and the second sub-light-conversion pattern CCL-GS2 may be spaced apart from at least one of the third and fourth sub-light-conversion patterns CCL-GS3 and CCL-GS4, when viewed in a plan view.

FIGS. 3A and 3B illustrate four gap regions GA, which are defined around each of the openings OP. As shown in FIG. 3B, the gap region GA may serve as a connection pathway of the second electrode CE (e.g., see FIG. 2B). The second electrode CE may include pixel or first portions CE-P, which are overlapped with the pixel regions PXA-R, PXA-G, and PXA-G, and non-pixel or second portions CE-NP, which are overlapped with the peripheral region NPXA. Due to the connection through the gap region GA, the pixel portions CE-P and the non-pixel portions CE-NP may be provided in the form of a single body.

As shown in FIG. 3C, the second light-blocking pattern LSP2 (illustrated with dark gray color) may enclose the opening OP, when viewed in a plan view. An opening LSP-OP corresponding to the opening OP of the pixel definition layer PDL may be defined in the second light-blocking pattern LSP2.

The opening LSP-OP of the second light-blocking pattern LSP2 may have an area that is larger than the opening OP of the pixel definition layer PDL (e.g., see FIG. 2B) in the plan view. When viewed in a plan view, at least a portion of the first light-conversion pattern CCL-GS may be exposed by the opening LSP-OP of the second light-blocking pattern LSP2. When viewed in a plan view, at least a portion of the first light-conversion pattern CCL-GS may be disposed between the opening OP and the second light-blocking pattern LSP2.

FIGS. 4A to 4I are cross-sectional views exemplarily illustrating a process of fabricating the display panel DP, according to an embodiment of the inventive concept. The following description will be given, based on the section shown in FIG. 2B. However, all of three kinds of the pixel regions PXA-R, PXA-G, and PXA-B are illustrated in FIGS. 4A to 4I. Elements, which are disposed below the third insulating layer 30 of the circuit element layer DP-CL, are not shown in FIGS. 4A to 4I.

As shown in FIG. 4A, the first electrodes AE of the first, second, and third pixel regions PXA-R, PXA-G, and PXA-B may be formed on the third insulating layer 30. The first electrodes AE may be formed by forming and patterning a conductive layer. As shown in FIG. 4A, the first electrode AE of the first pixel region PXA-R may have the largest area, and the first electrode AE of the third pixel region PXA-B may have the smallest area. Here, the area comparison is based on the assumption that a length of the first electrode AE in the second direction DR2 is the same.

The pixel definition layer PDL may be formed on the third insulating layer 30. The pixel definition layer PDL defining the opening OP may be formed by forming an organic layer and performing a photolithography process.

As shown in FIG. 4B, first light-conversion patterns CCL-RS and CCL-GS may be formed on the pixel definition layer PDL. The first light-conversion pattern CCL-RS (hereinafter, a first red light-conversion pattern) corresponding to the first pixel region PXA-R and the first light-conversion pattern CCL-GS (hereinafter, a first green light-conversion pattern) corresponding to the second pixel region PXA-G may be sequentially formed. The first red light-conversion pattern CCL-RS may include the first sub-light-conversion pattern CCL-RS1 and the second sub-light-conversion pattern CCL-RS2. The first green light-conversion pattern CCL-GS may include the first sub-light-conversion pattern CCL-GS1 and the second sub-light-conversion pattern CCL-GS2. The valley VL may be defined between the second sub-light-conversion pattern CCL-RS2 of the first red light-conversion pattern CCL-RS and the first sub-light-conversion pattern CCL-GS1 of the first green light-conversion pattern CCL-GS. In order to generate lights of different colors, the first red light-conversion pattern CCL-RS and the first green light-conversion pattern CCL-GS may include different quantum dots from each other.

An insulating partition wall IW-B corresponding to the third pixel region PXA-B may be formed on the pixel definition layer PDL. The insulating partition wall IW-B may include sub-insulating partition walls, which correspond to the sub-light-conversion patterns of the first red light-conversion pattern CCL-RS and the first green light-conversion pattern CCL-GS. A first sub-insulating partition wall IW-BS1 and a second sub-insulating partition wall IW-BS2 are illustrated in FIG. 4B. The valley VL may be formed between the second sub-light-conversion pattern CCL-GS2 of the first green light-conversion pattern CCL-GS and the first sub-insulating partition wall IW-BS1.

The insulating partition wall IW-B may not include a quantum dot. The insulating partition wall IW-B may include a base resin and a scattering particle which is mixed (or dispersed) in the base resin. The scattering particle may be a nano particle which is formed of or includes titanium oxide ($TiO_2$) or silica. In an embodiment, the scattering particle may not be included in the insulating partition wall IW-B, and the first red light-conversion pattern CCL-RS and the first green light-conversion pattern CCL-GS may further include the scattering particle.

As long as the insulating partition wall IW-B is disposed to correspond to the pixel region PXA-B displaying the same color light as the source light, the inventive concept is not limited to a specific color of the source light. In the present embodiment, the source light of blue color is exemplarily illustrated.

As shown in FIG. 4C, the first light-blocking pattern LSP1 of the metal layer may be formed. The first light-blocking pattern LSP1 may be disposed between the afore-described sub-light-conversion patterns CCL-RS2 and CCL- GS1 and between the sub-light-conversion pattern CCL-GS2 and the first sub-insulating partition wall IW-BS1. The first light-blocking pattern LSP1 may be formed by forming and patterning a metal layer. The metal layer may be formed by a sputtering process.

As shown in FIG. 4D, other elements of the emission element OLED may be additionally formed. At least the emission layer EML and the second electrode CE may be formed. The emission layer EML may be formed in the first, second, and third pixel regions PXA-R, PXA-G, and PXA-B by a deposition process. The emission layers EML in the first, second, and third pixel regions PXA-R, PXA-G, and PXA-B have the same material. At least one of the hole control layer HCL and the electron control layer ECL may be further formed. The second electrode CE may be formed by forming and patterning a conductive layer.

As shown in FIG. 4E, the upper insulating layer TFL may be formed on the second electrode CE. An inorganic layer may be formed by depositing an inorganic material, and an organic layer may be formed by depositing an organic monomer. The process of depositing inorganic material and the organic material may be performed several times. For example, processes of forming a first inorganic layer, forming an organic layer, and forming a second inorganic layer may be sequentially performed.

As shown in FIG. 4F, the second light-blocking pattern LSP2 may be formed using a photolithography process. The second light-blocking pattern LSP2 may be disposed on a portion of the upper insulating layer TFL, which is disposed on the first light-blocking pattern LSP1. In addition, a portion of the second light-blocking pattern LSP2 may be disposed on a portion of the first light-blocking pattern LSP1.

As shown in FIGS. 4G and 4H, the second light-conversion patterns CCL-RU and CCL-GU may be formed in the first and second pixel regions PXA-R and PXA-G, respectively. In an embodiment, a light scattering pattern SCL may be further formed in the third pixel region PXA-B. The second light-conversion pattern CCL-RU (hereinafter, a second red light-conversion pattern) corresponding to the first pixel region PXA-R and the second light-conversion pattern CCL-GU (hereinafter, a second green light-conversion pattern) corresponding to the second pixel region PXA-G may be sequentially formed. Thereafter, the light scattering pattern SCL may be formed. There may be no limitation in the order, in which they are formed.

As shown in FIG. 4G, solution may be used to form the second light-conversion patterns CCL-RU and CCL-GU and the light scattering pattern SCL. For example, the second light-conversion patterns CCL-RU and CCL-GU may be formed using a quantum dot solution. In an embodiment, the light scattering pattern SCL may be formed using a scattering particle solution.

The second light-blocking pattern LSP2 may serve as a partition wall to form the second light-conversion patterns CCL-RU and CCL-GU and the light scattering pattern SCL. For example, an inkjet head may be used to provide a red quantum dot solution onto the first pixel region PXA-R, to provide a green quantum dot solution onto the second pixel region PXA-G, and to provide the scattering particle solution onto the third pixel region PXA-B. The second light-blocking pattern LSP2 may prevent the red quantum dot solution, the green quantum dot solution, and the scattering particle solution from overflowing into a neighboring pixel region. The second light-conversion patterns CCL-RU and CCL-GU and the light scattering pattern SCL may be formed to have top surfaces which are positioned at a level different from (e.g., lower than) the top surface of the second light-blocking pattern LSP2.

The quantum dot solution may further include scattering particles and surfactant. In addition, the quantum dot solution and/or the scattering particle solution may further include epoxy or epoxy acrylate. For example, the quantum dot solution and/or the scattering particle solution may further include methyl-metha-acrylate ("MMA") or poly-methyl metha-acrylate ("PMMA"). The quantum dot solution and/or the scattering particle solution may further include solvent for an inkjet process.

Next, color filters CF-R, CF-G, and CF-B may be formed using a photolithography process. In an embodiment, three kinds of the color filters CF-R, CF-G, and CF-B may be formed by performing a photolithography process three times. A red color filter, a green color filter, and a blue color filter may be respectively formed in regions corresponding to the first to third pixel regions PXA-R, PXA-G, and PXA-B.

Thereafter, the insulating layer IL-F may be formed, as shown in FIG. 4I. The insulating layer IL-F providing a flat top surface may be formed by a process of depositing or coating an organic.

Figure 5:
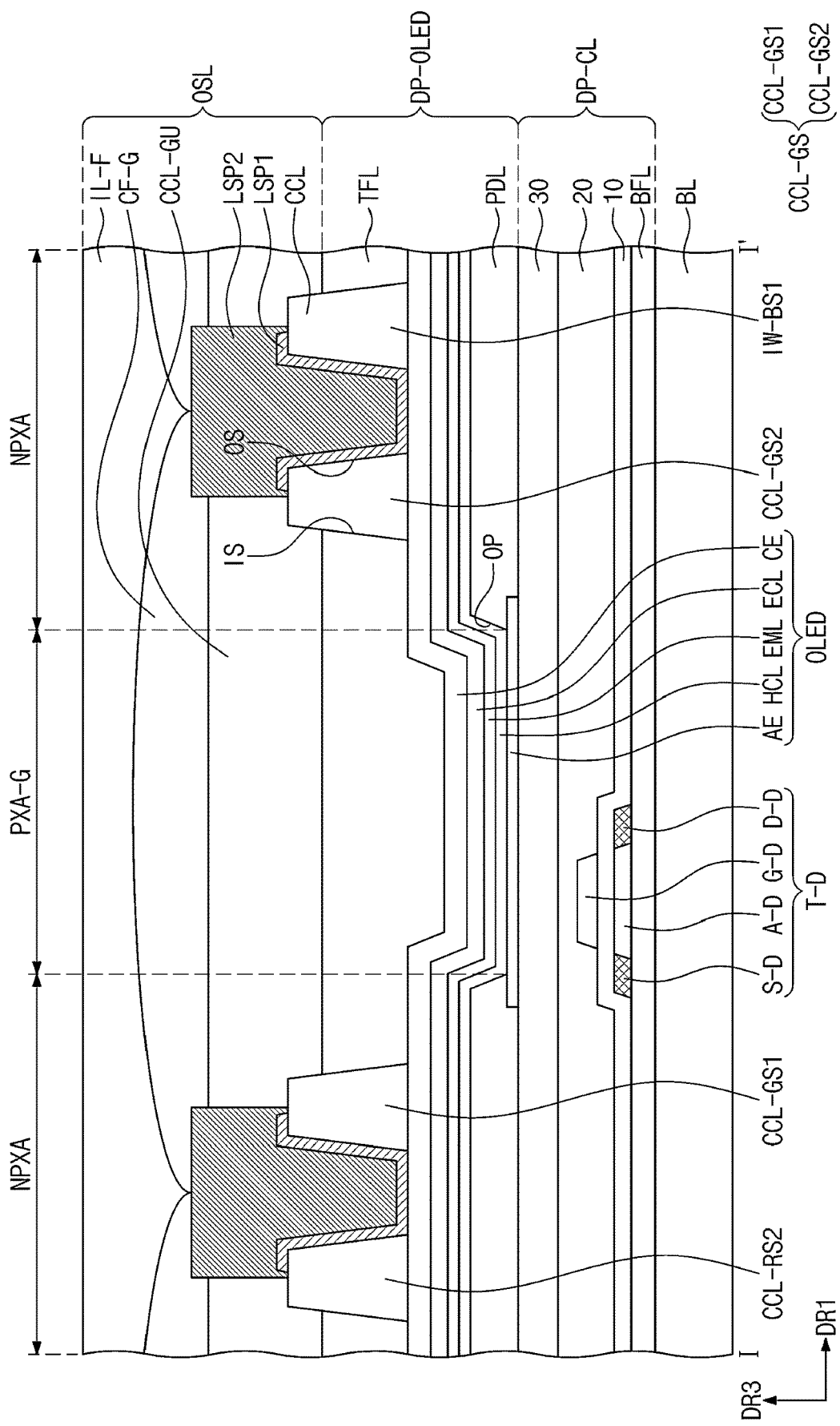
FIG. 5 is a cross-sectional view illustrating a display panel according to an embodiment of the inventive concept.
Figure 6:
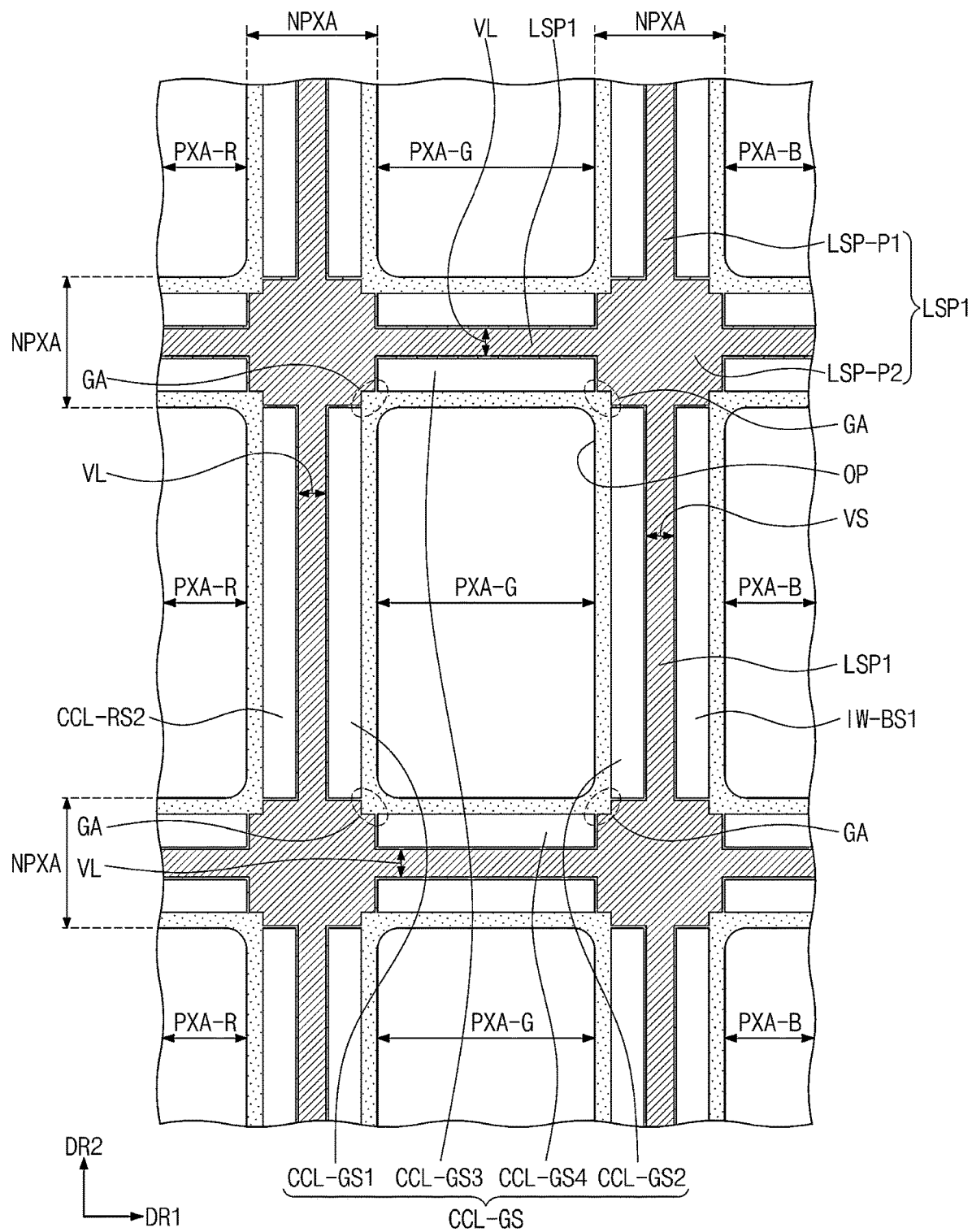
FIG. 6 is a plan view illustrating a display panel according to an embodiment of the inventive concept.

FIG. 5 is a cross-sectional view illustrating the display panel DP according to an embodiment of the inventive concept. FIG. 6 is a plan view illustrating the display panel DP according to an embodiment of the inventive concept. FIG. 5 illustrates a section corresponding to FIG. 2B. FIG. 6 illustrates a portion corresponding to FIG. 3A. For concise description, an element previously described with reference to FIGS. 2B and 3A to 3C may be identified by the same reference number without repeating an overlapping description thereof.

In the peripheral region NPXA, the hole control layer HCL, the electron control layer ECL, and the second electrode CE may be disposed on the pixel definition layer PDL, as shown in FIG. 5. The first light-conversion pattern CCL-GS may be directly disposed on the second electrode CE. The second electrode CE may be a single shape, which is fully overlapped with the first to third pixel regions PXA-R, PXA-G, and PXA-B (e.g., see FIG. 2A) and the peripheral region NPXA (e.g., see FIG. 2A) in the plan view.

A portion of the first light-blocking pattern LSP1 may be in contact with the second electrode CE. In the peripheral region NPXA, the emission layer EML may be further disposed on the pixel definition layer PDL, and in an embodiment, at least one of the hole control layer HCL, the electron control layer ECL, and the second electrode CE, which are disposed on the pixel definition layer PDL in the peripheral region NPXA, may be omitted.

As shown in FIG. 6, the first light-blocking pattern LSP1 may be provided in the form of a single object (i.e., monolithic object). That is, according to the present embodiment, the first light-blocking patterns LSP1, which are spaced apart from each other in FIG. 3A, may be connected to each other in FIG. 6.

In the present embodiment, the first light-blocking pattern LSP1 may include first portions LSP-P1 and second portions LSP-P2. The first portions LSP-P1 may be a portion corresponding to the plurality of first light-blocking patterns LSP1 described with reference to FIG. 3A. The second portions LSP-P2 may not define the valley VL, unlike the first portions LSP-P1. Each of the second portions LSP-P2 may be connected to four first portions LSP-P1.

Each of the second portions LSP-P2 may be connected to the second electrode CE. The second portions LSP-P2 may be directly disposed on the second electrode CE to be in contact with the second electrode CE. The second portions LSP-P2 may lower an electrical resistance of the second electrode CE. The second portions LSP-P2 may physically compensate a portion of the second electrode CE, which is opened in the gap region GA. That is, the second portions LSP-P2 may serve as an element repairing a failure of the second electrode CE.

The second light-blocking pattern LSP2 of FIG. 3C may sufficiently cover the first light-blocking pattern LSP1 of FIG. 6 which is provided in the form of a single object (i.e., monolithic object).

Figure 7:
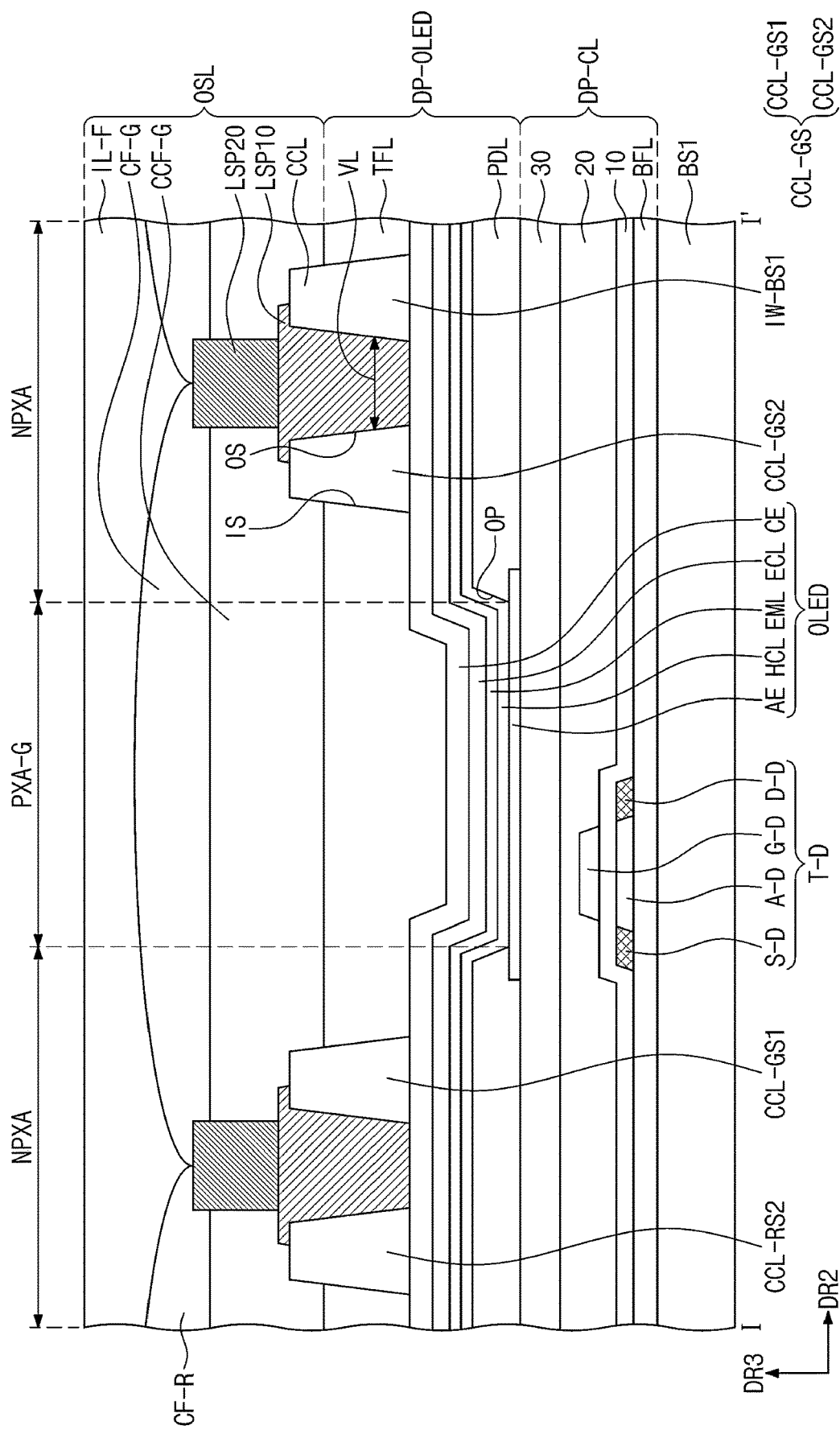
FIG. 7 is a cross-sectional view illustrating a display panel according to an embodiment of the inventive concept.
Figure 8:
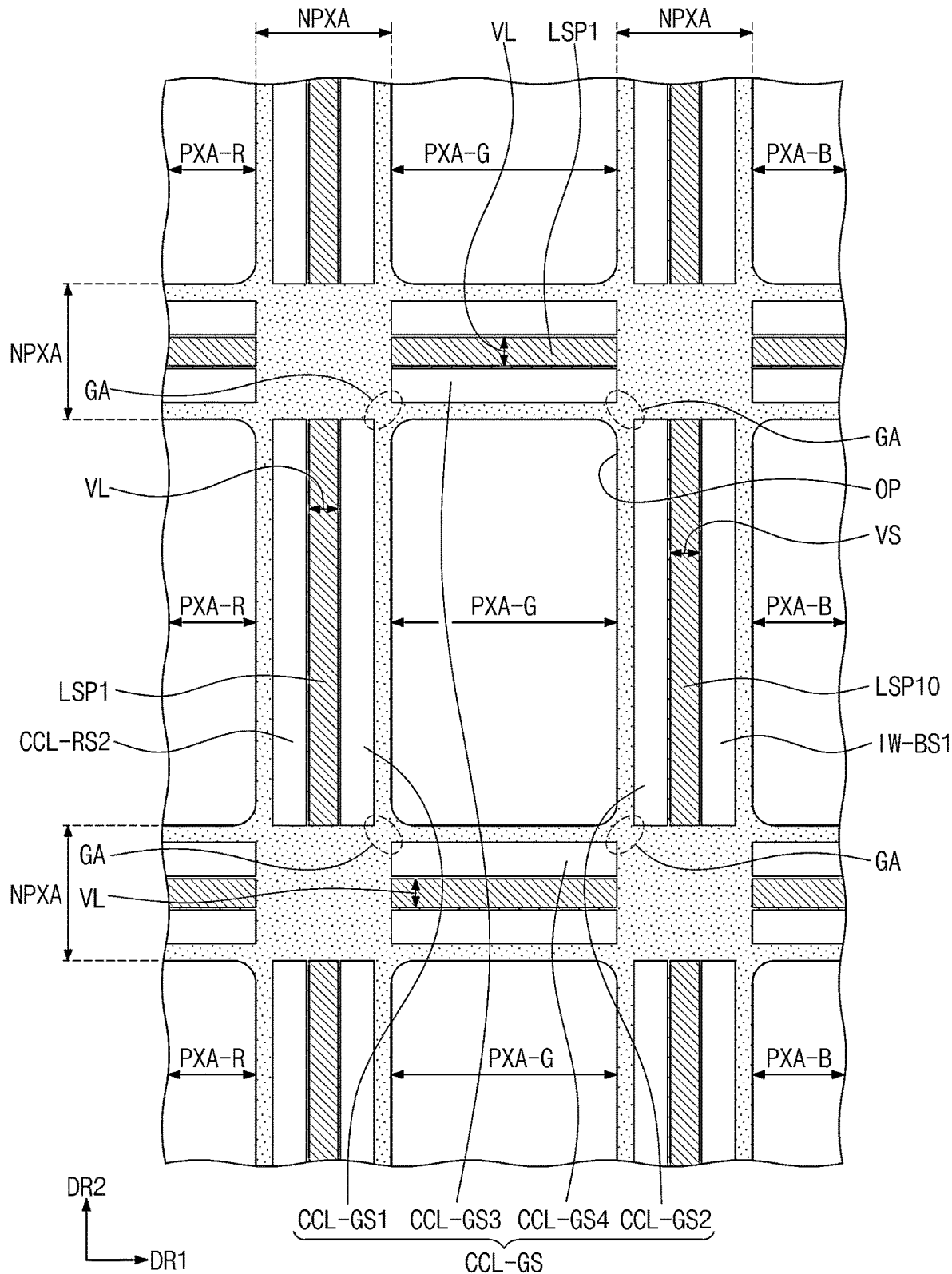
FIG. 8 is a plan view illustrating a display panel according to an embodiment of the inventive concept.
Figure 9:
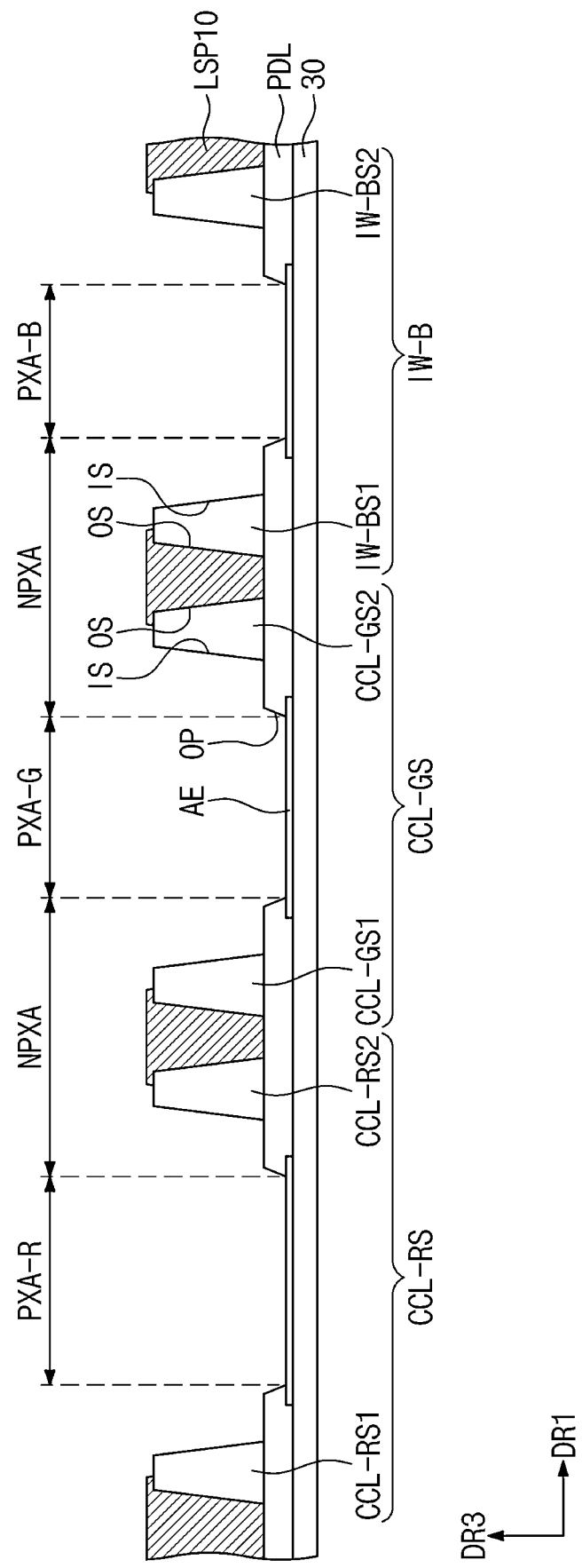
FIG. 9 is a cross-sectional view exemplarily illustrating a process of fabricating a display panel, according to an embodiment of the inventive concept.

FIG. 7 is a cross-sectional view illustrating the display panel DP according to an embodiment of the inventive concept. FIG. 8 is a plan view illustrating the display panel DP according to an embodiment of the inventive concept. FIG. 9 is a cross-sectional view exemplarily illustrating a process of fabricating the display panel DP according to an embodiment of the inventive concept. FIG. 7 illustrates a portion corresponding to FIG. 2B, FIG. 8 illustrates a portion corresponding to FIG. 3A, and FIG. 9 illustrates a portion corresponding to FIG. 4C. For concise description, an element previously described with reference to FIGS. 1A to 6 may be identified by the same reference number without repeating an overlapping description thereof.

Referring to FIGS. 7 and 8, the first light-blocking pattern LSP1 of the metal layer shown in FIG. 2B may be replaced with a first light-blocking pattern LSP10 containing a black coloring agent. The first light-blocking pattern LSP10 may fill the valley VL. The second light-blocking pattern LSP20 may be disposed on and aligned to the first light-blocking pattern LSP10.

The second light-blocking pattern LSP20 may include a black coloring agent. A portion of the first light-blocking pattern LSP10 may be exposed from the second light-blocking pattern LSP20.

In an embodiment, the second light-blocking pattern LSP20 may be replaced with a conventional insulating pattern. In the embodiment of FIG. 2B, the second light-blocking pattern LSP2 may prevent an external light from being reflected by the first light-blocking pattern LSP1 of the metal layer. By contrast, in the present embodiment, since the first light-blocking pattern LSP1 includes the black coloring agent, it may be sufficient that the second light-blocking pattern LSP20 serves as the partition wall described with reference to FIG. 4G.

According to the fabrication method of FIG. 9, the first light-blocking pattern LSP10 may be formed in the valley VL, unlike the method of forming the metal layer in the step of FIG. 4C. The first light-blocking pattern LSP10 may be formed through a conventional photolithography process. A subsequent process may be performed in substantially the same manner as those described with reference to FIGS. 4D to 4I. The first light-blocking pattern LSP10 may be formed by patterning an organic layer with a black coloring agent.

According to an embodiment of the inventive concept, a light-conversion pattern (hereinafter, a front light-conversion pattern) may be disposed in a region, which is overlapped with an emission element when viewed in a plan view, whereas a light-conversion pattern (hereinafter, a lateral light-conversion pattern) may be disposed in a region, which is not overlapped with the emission element or is provided outside the emission element. A source light, which is reflected by the front light-conversion pattern or is not directly incident into the front light-conversion pattern, may be converted by the lateral light-conversion pattern and then may be emitted to the outside through a pixel region. Accordingly, it may be possible to increase an amount of conversion light, which is converted from the source light and thereby to improve optical conversion efficiency of a display panel.

While example embodiments of the inventive concept have been particularly shown and described, it will be understood by one of ordinary skill in the art that variations in form and detail may be made therein without departing from the spirit and scope of the attached claims.

What is claimed is:

1. A display panel, comprising:
an emission element which outputs a source light and includes a first electrode, an emission layer disposed on the first electrode, and a second electrode disposed on the emission layer;
a pixel definition layer, in which an opening exposing at least a portion of the first electrode is defined;
a first light-conversion pattern disposed on the pixel definition layer;
a first light-blocking pattern disposed on an outer side of the first light-conversion pattern in a plan view; and
a second light-conversion pattern disposed on the emission element and which overlaps with the emission element in the plan view, wherein the first and second light-conversion patterns are spaced apart from each other or forming an interface therebetween.

2. The display panel of claim 1, wherein the first light-conversion pattern is in contact with the pixel definition layer.

3. The display panel of claim 1, wherein the emission element further comprises at least one of a hole control layer and an electron control layer, which overlaps with at least the emission layer in the plan view, and
a portion of the at least one of the hole and electron control layers is disposed between the pixel definition layer and the first light-conversion pattern.

4. The display panel of claim 1, wherein the first light-conversion pattern comprises a plurality of sub-light-conversion patterns which are disposed outside the opening in the plan view, and
at least two adjacent sub-light-conversion patterns of the plurality of sub-light-conversion patterns are spaced apart from each other in the plan view.

5. The display panel of claim 1, wherein the first light-conversion pattern comprises:
a first sub-light-conversion pattern and a second sub-light-conversion pattern, which are spaced apart from each other in a first direction crossing an extension direction of the first and second sub-light-conversion patterns; and
a third sub-light-conversion pattern and a fourth sub-light-conversion pattern, which are spaced apart from each other in a second direction crossing an extension direction of the third and fourth sub-light-conversion patterns,
wherein the extension direction of the first sub-light-conversion pattern and the extension direction of the third sub-light-conversion pattern cross each other,
the first sub-light-conversion pattern is spaced apart from at least one of the third and fourth sub-light-conversion patterns in the plan view, and
the second sub-light-conversion pattern is spaced apart from at least one of the third and fourth sub-light-conversion patterns in the plan view.

6. The display panel of claim 1, further comprising a color filter which overlaps with the emission element in the plan view.

7. The display panel of claim 6, further comprising an organic layer, which is disposed on the color filter and provides a flat top surface.

8. The display panel of claim 1, wherein the first light-conversion pattern and the second light-conversion pattern comprise a same quantum dot.

9. The display panel of claim 1, further comprising a second light-blocking pattern disposed on the first light-blocking pattern.

10. The display panel of claim 9, wherein the first light-blocking pattern comprises a metal layer, and
the second light-blocking pattern comprises a black coloring agent.

11. The display panel of claim 9, wherein the first light-blocking pattern and the second light-blocking pattern comprise a black coloring agent.

12. The display panel of claim 9, wherein the second light-blocking pattern encloses the opening in the plan view, and
at least a portion of the first light-conversion pattern is disposed between the opening and the second light-blocking pattern in the plan view.

13. A display panel, comprising:
a first emission element and a second emission element, each of which outputs a source light and includes a first electrode, an emission layer disposed on the first electrode, and a second electrode disposed on the emission layer;
a pixel definition layer, in which a first opening and a second opening are defined, the first and second openings at least partially exposing the first electrodes of the first and second emission elements, respectively;
a plurality of first lateral light-conversion patterns which are disposed on the pixel definition layer and enclose the first opening in a plan view;
a plurality of second lateral light-conversion patterns which are disposed on the pixel definition layer and enclose the second opening in the plan view;
a first front light-conversion pattern and a second front light-conversion pattern disposed on the first emission element and the second emission element, respectively; and
a first light-blocking pattern disposed on outer sides of the plurality of first lateral light-conversion patterns and outer sides of the plurality of second lateral light-conversion patterns in the plan view.

14. The display panel of claim 13, wherein the first electrode of the first emission element and the first electrode of the second emission element are spaced apart from each other in the plan view, and
the second electrode of the first emission element and the second electrode of the second emission element are provided in a form of a single object.

15. The display panel of claim 14, wherein two adjacent first lateral light-conversion patterns of the plurality of first lateral light-conversion patterns are spaced apart from each other to form a gap region therebetween in the plan view, and
a portion of the second electrode is disposed in the gap region.

16. The display panel of claim 13, wherein the first light-blocking pattern comprises a metal layer,
the metal layer is disposed between a first lateral light-conversion pattern and a second lateral light-conversion pattern, which are selected from the plurality of first lateral light-conversion patterns and the plurality of second lateral light-conversion patterns, respectively, and are adjacent to each other, and
the metal layer is disposed on surfaces of the outer sides of the first and second lateral light-conversion patterns.

17. The display panel of claim 16, further comprising an upper insulating layer disposed on the first emission element, the second emission element, and the metal layer.

18. The display panel of claim 17, further comprising a second light-blocking pattern disposed on the first light-blocking pattern,
wherein the second light-blocking pattern is disposed on a portion of the upper insulating layer, and
the second light-blocking pattern is disposed on the metal layer.

19. The display panel of claim 16, wherein the second electrode of the first emission element and the second electrode of the second emission element are provided in a form of a single object, and
the metal layer is in contact with the second electrode.

20. The display panel of claim 13, wherein the first light-blocking pattern comprises a black coloring agent,
the black coloring agent is disposed between a first lateral light-conversion pattern and a second lateral light-conversion pattern, which are selected from the plurality of first lateral light-conversion patterns and the plurality of second lateral light-conversion patterns, respectively, and are adjacent to each other, and
the black coloring agent fills a valley defined between the first and second lateral light-conversion patterns.

21. The display panel of claim 13, further comprising a second light-blocking pattern disposed on the first light-blocking pattern,
wherein the second light-blocking pattern encloses the first opening and the second opening in the plan view, and
the first front light-conversion pattern and the second front light-conversion pattern have top surfaces which are positioned at a level different from or lower than a top surface of the second light-blocking pattern.

22. The display panel of claim 21, further comprising:
a first color filter which transmits a first light emitted from the plurality of first lateral light-conversion patterns and the first front light-conversion pattern; and
a second color filter which transmits a second light emitted from the plurality of second lateral light-conversion patterns and the second front light-conversion pattern.

* * * * *